(12) United States Patent
Gu et al.

(10) Patent No.: US 12,032,790 B2
(45) Date of Patent: Jul. 9, 2024

(54) DISPLAY DEVICE AND TOUCH SENSING SYSTEM INCLUDING THE SAME

(71) Applicant: SAMSUNG DISPLAY CO., LTD., Yongin-si (KR)

(72) Inventors: Da Som Gu, Yongin-si (KR); Ki Jun Roh, Yongin-si (KR); Gil Yeong Park, Yongin-si (KR); Sung Guk An, Yongin-si (KR); Hee Young Lee, Yongin-si (KR); So Yeon Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/158,951

(22) Filed: Jan. 24, 2023

(65) Prior Publication Data
US 2023/0418418 A1  Dec. 28, 2023

(30) Foreign Application Priority Data

Jun. 27, 2022  (KR) ......................... 10-2022-0077954

(51) Int. Cl.
| | | |
|---|---|---|
| G06F 3/042 | (2006.01) | |
| G02F 1/1333 | (2006.01) | |
| G02F 1/1337 | (2006.01) | |
| G06F 3/0354 | (2013.01) | |
| G06F 3/041 | (2006.01) | |

(Continued)

(52) U.S. Cl.
CPC .......... *G06F 3/042* (2013.01); *G02F 1/13338* (2013.01); *G02F 1/1337* (2013.01); *G06F 3/03542* (2013.01); *G06F 3/0416* (2013.01); *G06F 3/0446* (2019.05); *H10K 59/40* (2023.02); *G02F 2203/11* (2013.01); *G06F 2203/04106* (2013.01); *G06F 2203/04111* (2013.01)

(58) Field of Classification Search
CPC .. G06F 3/037; G06F 3/03545; G06F 3/03542; G06F 3/0383
See application file for complete search history.

(56) References Cited

U.S. PATENT DOCUMENTS

| | | | | |
|---|---|---|---|---|
| 2004/0090579 | A1* | 5/2004 | Kim ................... | G02F 1/133536 349/123 |
| 2012/0008200 | A1* | 1/2012 | Silverstein ............. | G03B 33/16 977/774 |

(Continued)

FOREIGN PATENT DOCUMENTS

| | | |
|---|---|---|
| JP | 6855677 | 4/2021 |
| KR | 10-1387005 | 4/2014 |

(Continued)

*Primary Examiner* — Kevin M Nguyen
(74) *Attorney, Agent, or Firm* — F. Chau & Associates, LLC

(57) ABSTRACT

A display device includes: a substrate; a display layer disposed on the substrate and including a plurality of light emitting areas; a code pattern layer disposed on the display layer and including a plurality of position code patterns; and a reflective layer that receives first light incident from the outside having a first wavelength band and reflects the first light to generate second light having a second wavelength band, wherein a second peak wavelength of the second light is smaller than a first peak wavelength of the first light.

23 Claims, 25 Drawing Sheets

(51) Int. Cl.
*G06F 3/044* (2006.01)
*H10K 59/40* (2023.01)

(56) References Cited

U.S. PATENT DOCUMENTS

2013/0127334 A1* 5/2013 Fukuda .................. H05B 33/22
    313/504
2014/0145066 A1* 5/2014 Geaghan ............... G06F 3/0321
    250/206.1
2017/0227693 A1* 8/2017 Ito ........................... G02B 5/26

FOREIGN PATENT DOCUMENTS

KR      20-0485305      12/2017
KR   10-2020-0088532     7/2020

* cited by examiner

FIG. 24
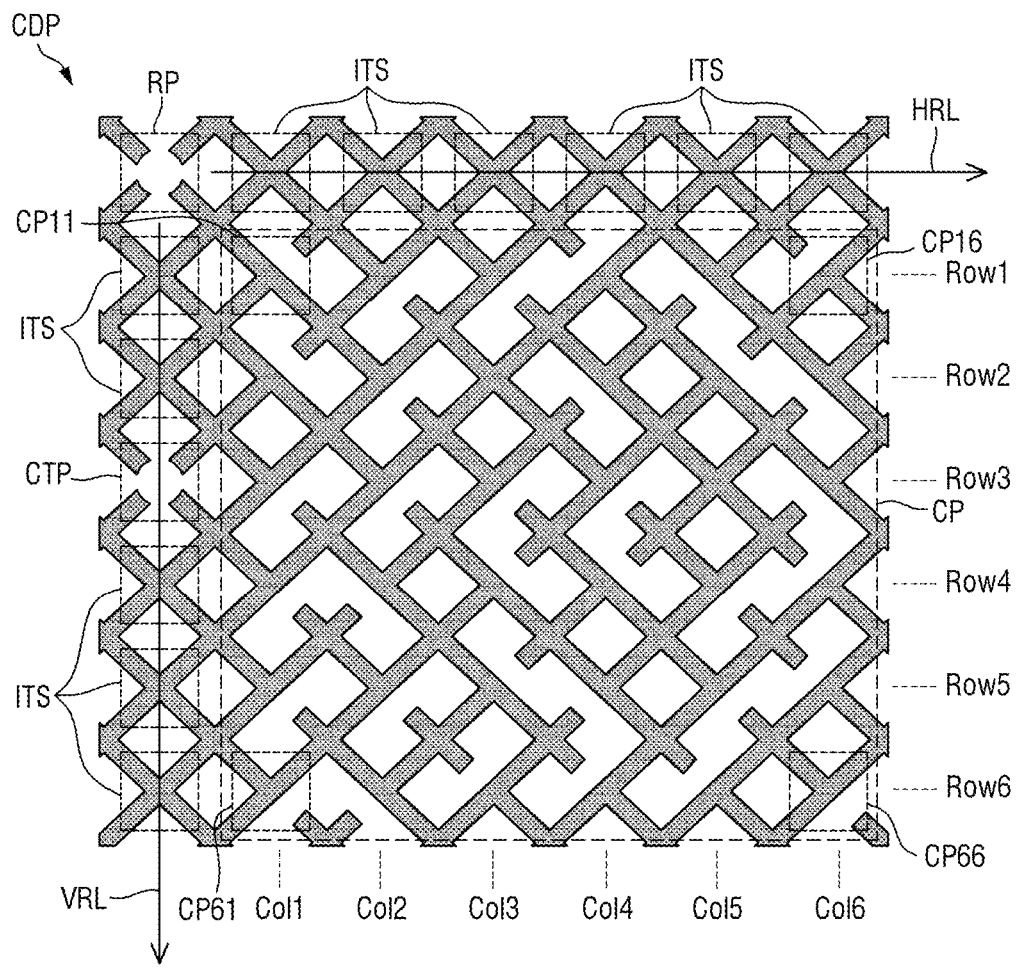
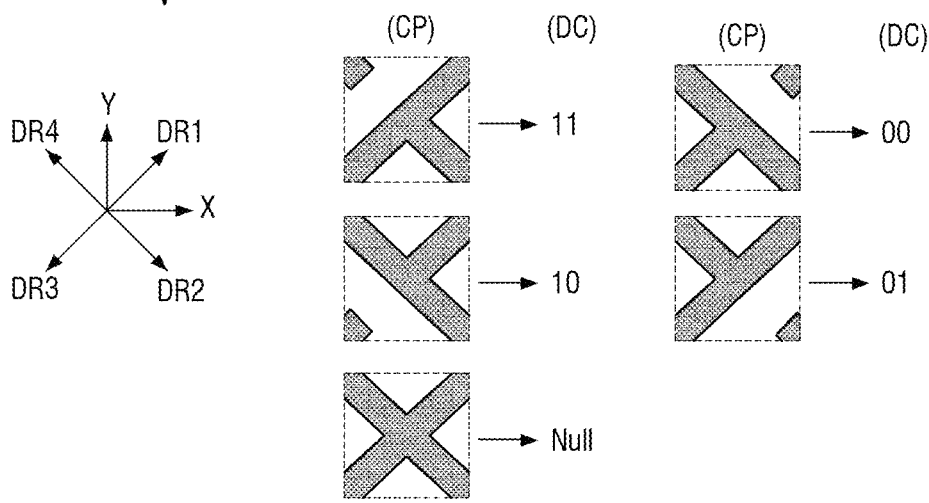

FIG. 25

|       | Col1 | Col2 | Col3 | Col4 | Col5 | Col6 |
|-------|------|------|------|------|------|------|
| Row1  | 00   | 01   | 01   | 11   | 10   | 11   |
| Row2  | 00   | 01   | Null | 10   | 00   | 10   |
| Row3  | 01   | 01   | 01   | 01   | Null | 10   |
| Row4  | 01   | 10   | 00   | 00   | 01   | 11   |
| Row5  | 01   | 01   | 00   | 10   | 01   | 11   |
| Row6  | 01   | 10   | 11   | 11   | 11   | 01   |

DISPLAY DEVICE AND TOUCH SENSING SYSTEM INCLUDING THE SAME

CROSS-REFERENCE TO RELATED APPLICATION

This U.S. provisional patent application claims priority under 35 U.S.C. § 119 to Korean Patent Application No. 10-2022-0077954 filed on Jun. 27, 2022 in the Korean Intellectual Property Office, the disclosure of which is incorporated by reference in its entirety herein.

TECHNICAL FIELD

The disclosure relates to a display device and a touch sensing system including the same.

DISCUSSION OF RELATED ART

As the information society develops, the demand for a display device for displaying an image is increasing in various forms. For example, display devices are applied to various electronic devices such as smartphones, digital cameras, laptop computers, navigation devices, and smart televisions. The display device may be a flat panel display device such as a liquid crystal display device, a field emission display device, or an organic light emitting display device.

Recent display devices support a touch input using a portion (e.g., a finger) of a user's body and direct or proximity touch sensing using an external position input device. For example, the position input device may more precisely sense the touch input by sensing the touch input using light reflected from patterns previously input to the display device. However, it may be difficult for the position input device to recognize the reflected light to accurately obtain the patterns.

SUMMARY

At least one embodiment of the disclosure provides a display device capable of sensing an accurate position code pattern by differently adjusting peak wavelengths of light emitted from a position input device and light reflected and received from the display device, and a touch sensing system including the same.

According to an embodiment of the disclosure, a display device includes, a substrate, a display layer disposed on the substrate and including a plurality of light emitting areas, a code pattern layer disposed on the display layer and including a plurality of position code patterns, and a reflective layer that receives a first light having a first wavelength band incident from the outside and reflects the first light to generate second light having a second wavelength band, wherein a second peak wavelength of the second light is smaller than a first peak wavelength of the first light.

In an embodiment, when the first peak wavelength refers to a wavelength of the first light having a highest intensity in the first wavelength band, and the second peak wavelength refers to a wavelength of the second light having a highest intensity in the second wavelength band, the second peak wavelength may be smaller than the first peak wavelength by 50 nm to 100 nm.

In an embodiment, a central wavelength of the second wavelength band is smaller than a central wavelength of the first wavelength band.

In an embodiment, the first wavelength band is 780 nm to 900 nm, and the second wavelength band is 860 nm to 1010 nm.

In an embodiment, when a ratio of an intensity of the second light to an intensity of the first light is defined as a reflectance of the reflective layer, the reflectance is 10% to 50%.

In an embodiment, the reflective layer is disposed on the code pattern layer.

In an embodiment, the reflective layer may include, a first orientation film, a second orientation film disposed on the first orientation film, and a liquid crystal layer disposed between the first orientation film and the second orientation film and including cholesteric liquid crystals.

In an embodiment, liquid crystal molecules of the cholesteric liquid crystals are arranged in a helical shape along a thickness direction of the liquid crystal layer.

According to an embodiment of the disclosure, a touch sensing system includes, a display device for displaying an image, and a position input device for outputting first light having a first wavelength band, wherein the display device includes, a display layer including a plurality of light emitting areas, a code pattern layer disposed on the display layer and including a plurality of position code patterns, and a reflective layer receiving the first light and reflecting the first light to generate second light having a second wavelength band different from the first wavelength band, wherein the position input device senses the second light reflected by the plurality of position code patterns, determines codes of the plurality of position code patterns from the sensed second light and calculates touch coordinate data by analyzing the codes.

In an embodiment, a central wavelength of the second wavelength band is smaller than a central wavelength of the first wavelength band.

In an embodiment, when a wavelength of the first light having a highest intensity in the first wavelength band is defined as a first peak wavelength, and a wavelength of the second light having a highest intensity in the second wavelength band is defined as a second peak wavelength, the second peak wavelength of the second light may be smaller than the first peak wavelength of the first light.

In an embodiment, the second peak wavelength is smaller than the first peak wavelength by 50 nm to 100 nm.

In an embodiment, when a ratio of an intensity of the second light to an intensity of the first light is defined as a reflectance of the reflective layer, the reflectance may be 10% to 50%.

The touch sensing system may further include a main processor receiving the touch coordinate data from the position input device and executing an application corresponding to the touch coordinate data.

The touch sensing system may further include a main processor calculating touch coordinate data by sensing a change in capacitance formed by a plurality of touch electrodes and executing an application corresponding to the touch coordinate data, the code pattern layer including the plurality of touch electrodes.

In an embodiment, the position input device includes, a light emitting portion emitting the first light to the display device, and a light receiving portion receiving the second light reflected from the display device, and the light emitting portion emits infrared light.

In an embodiment, the light receiving portion receives the infrared light.

In an embodiment, the light emitting portion emits light having a wavelength of 780 nm to 900 nm, and the light receiving portion receives light having a wavelength of 840 nm to 1010 nm.

In an embodiment, the reflective layer includes, a first orientation film, a second orientation film disposed on the first orientation film, and a first liquid crystal layer disposed between the first orientation film and the second orientation film and including cholesteric liquid crystals.

In an embodiment, liquid crystal molecules of the cholesteric liquid crystals are arranged in a helical shape along a thickness direction of the first liquid crystal layer.

According to an embodiment of the display device and the touch sensing system including the same, the peak wavelengths of the light emitted from the position input device and the light reflected and received from the display device may be differently adjusted by disposing a reflective layer on one surface of the position code pattern of the display device. That is, an accurate position code pattern may be sensed by disposing the reflective layer that adjusts the peak wavelength of the received light.

According to an embodiment of the disclosure, a display device includes a processor, a display panel having a plurality of pixels for displaying an image, a touch panel having a plurality of electrodes, wherein a first set of the electrodes are for sensing a touch input and a second other set of the electrodes are code patterns, where each code pattern represents one of a plurality data codes. A reflective layer of the display panel is configured to receive a first light having a first wavelength band and reflect the first light off the code patterns to generate second light having a second wavelength band different from the first wavelength band. A first peak wavelength of the first light may be greater than a second peak wavelength of the second light. A central wavelength of the second wavelength band is smaller than a central wavelength of the first wavelength band.

BRIEF DESCRIPTION OF THE DRAWINGS

The above and other aspects and features of the disclosure will become more apparent by describing in detail embodiments thereof with reference to the attached drawings, in which:

FIG. 24 is a view illustrating an example of a code pattern unit in the display device according to an embodiment; and FIG. 25 is a view illustrating a data code corresponding to the code pattern unit of FIG. 24.

DETAILED DESCRIPTION OF THE EMBODIMENTS

The inventive concept will now be described more fully hereinafter with reference to the accompanying drawings, in which example embodiments of the inventive concept are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Hereinafter, example embodiments will be described with reference to the accompanying drawings.

Figure 1:
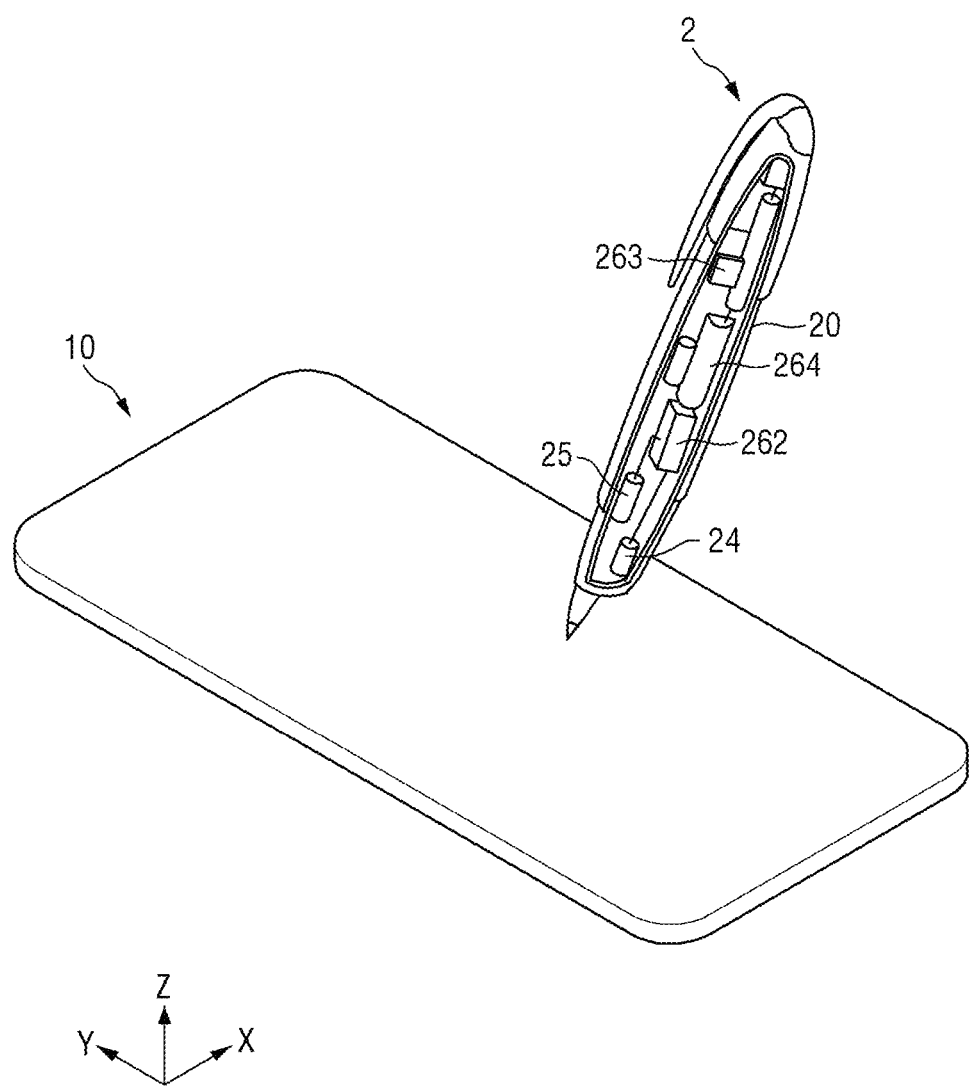
FIG. 1 is an illustrative view illustrating a position input device and a display device according to an embodiment.
Figure 2:
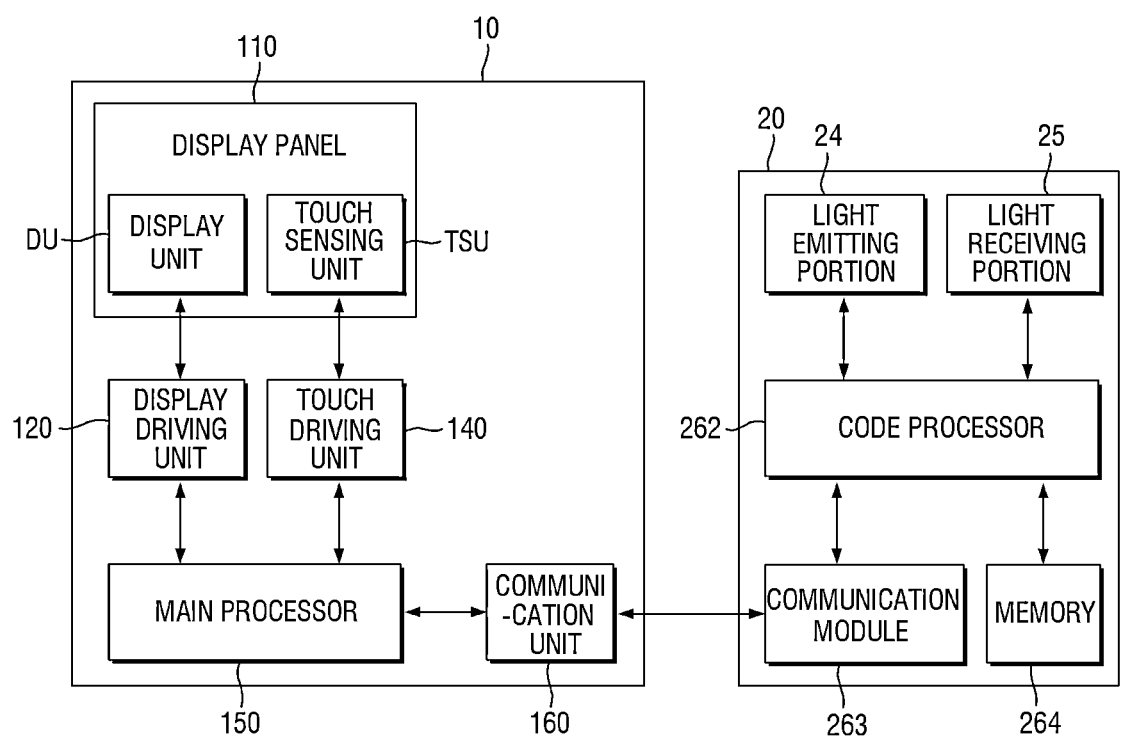
FIG. 2 is a block diagram illustrating the position input device and the display device according to an embodiment.

FIG. 1 is a configuration view illustrating a position input device (e.g., an electronic pen or stylus) and a display device according to an embodiment. FIG. 2 is a block diagram illustrating the position input device and the display device according to an embodiment.

Referring to FIGS. 1 and 2, a touch sensing system according to an embodiment includes a display device 10 and a position input device 2. The display device 10 includes a display panel 110, a display driving unit 120 (e.g., driving circuit), a touch driving unit 140 (e.g., a driving circuit), a main processor 150, and a communication unit 160 (e.g., a modem, transceiver).

The display device 10 uses the position input device 2 as a touch input mechanism. The position input device 2 is an electronic pen that senses display light of the display panel 110 or light reflected from the display panel 110 using an optical method, and may detect a code pattern included in the display panel 110 based on the sensed light and generate coordinate data from the detected code pattern.

The display panel 110 may include a display unit DU displaying an image, and a touch sensing unit TSU (e.g., a touch panel or touch sensing device) sensing a body portion such as a finger and the position input device 2. The display unit DU may include a plurality of pixels and display an image through the plurality of pixels. The display unit DU may display an image including code patterns through the plurality of pixels.

The touch sensing unit TSU may include a plurality of touch electrodes to sense a user's touch in a capacitive method. Here, at least some of the plurality of touch electrodes may also sense a touch of the position input device 2 by including a code pattern unit (CDP in FIG. 23).

The code pattern unit (CDP in FIG. 23) of the display panel 110 may include code patterns cut according to a specific criterion to form a specific code representing position information. The code patterns may correspond to a value of a preset data code. Detailed configuration features of the touch sensing unit TSU as well as the display panel 110, the code pattern unit (CDP in FIG. 23), and detailed structures of the code patterns will be described later in more detail with reference to the accompanying drawings.

The display driving unit 120 may output signals and voltages for driving the display unit DU. The display driving unit 120 may supply data voltages to data lines. The display driving unit 120 may supply a power voltage to a power line and may supply gate control signals to a gate driving unit.

The touch driving unit 140 may be connected to the touch sensing unit TSU. The touch driving unit 140 may supply a touch driving signal to the plurality of touch electrodes of the touch sensing unit TSU, and may sense an amount of change in capacitance between the plurality of touch electrodes. The touch driving unit 140 may calculate whether a user's touch input has occurred and touch coordinates based on the amount of change in capacitance between the plurality of touch electrodes. The touch coordinates may indicate a location of the user's touch input on the display panel 110. For example, the touch coordinates may indicate which pixel or pixels of the display unit DU was touched.

The main processor 150 may control all functions of the display device 10. For example, the main processor 150 may supply digital video data to the display driving unit 120 so that the display panel 110 displays an image. For example, the main processor 150 may receive touch data from the touch driving unit 140 to determine a user's touch coordinates, and then generate digital video data according to the touch coordinates or execute an application indicated by an icon displayed on the display panel 100 at the user's touch coordinates. As another example, the main processor 150 may receive coordinate data from the position input device 2 to determine touch coordinates of the position input device 2, and then generate digital video data according to the touch coordinates or execute an application indicated by an icon displayed on the touch coordinates of the position input device 2.

The communication unit 160 may perform wired/wireless communication with an external device. For example, the communication unit 160 may transmit and receive communication signals to and from a communication module 263 (e.g., a modem, transceiver, etc.) of the position input device 2. The communication unit 160 may receive the coordinate data including data codes from the position input device 2, and may provide the coordinate data to the main processor 150.

The position input device 2 according to an embodiment includes a body portion 20 and a pen tip portion 30. The position input device 2 may be formed in a shape of a writing instrument such as a fountain pen through the body portion 20 and the pen tip portion 30 constituting an overall appearance, but embodiments of the disclosure are not limited thereto. That is, the position input device 2 is not limited to the shape or structure of a writing instrument.

The position input device 2 includes a body portion 20, a light emitting portion 24, a light receiving portion 25, a light transmitting layer, and a control unit.

The light emitting portion 24 may be disposed on the body portion 20 at a position adjacent to the pen tip portion of the position input device 2. The light emitting portion 24 may emit light in one direction. For example, the light emitting portion 24 may emit infrared light from one end of the body portion 20 using at least one infrared light source. At least one infrared light source module included in the light emitting portion 24 may include an infrared light-emitting diode (LED) array having a matrix structure.

The light receiving portion 25 is disposed on the body portion 20 at a position adjacent to the pen tip portion of the position input device 2 to sense an image signal related to the code pattern unit (CDP in FIG. 23) included in the display panel 110 of the display device 10. Specifically, the light receiving portion 25 may detect infrared light reflected from the code patterns of the code pattern unit (CDP in FIG. 23) with an infrared camera. For example, the light receiving portion 25 may be an infrared camera.

Figure 12:
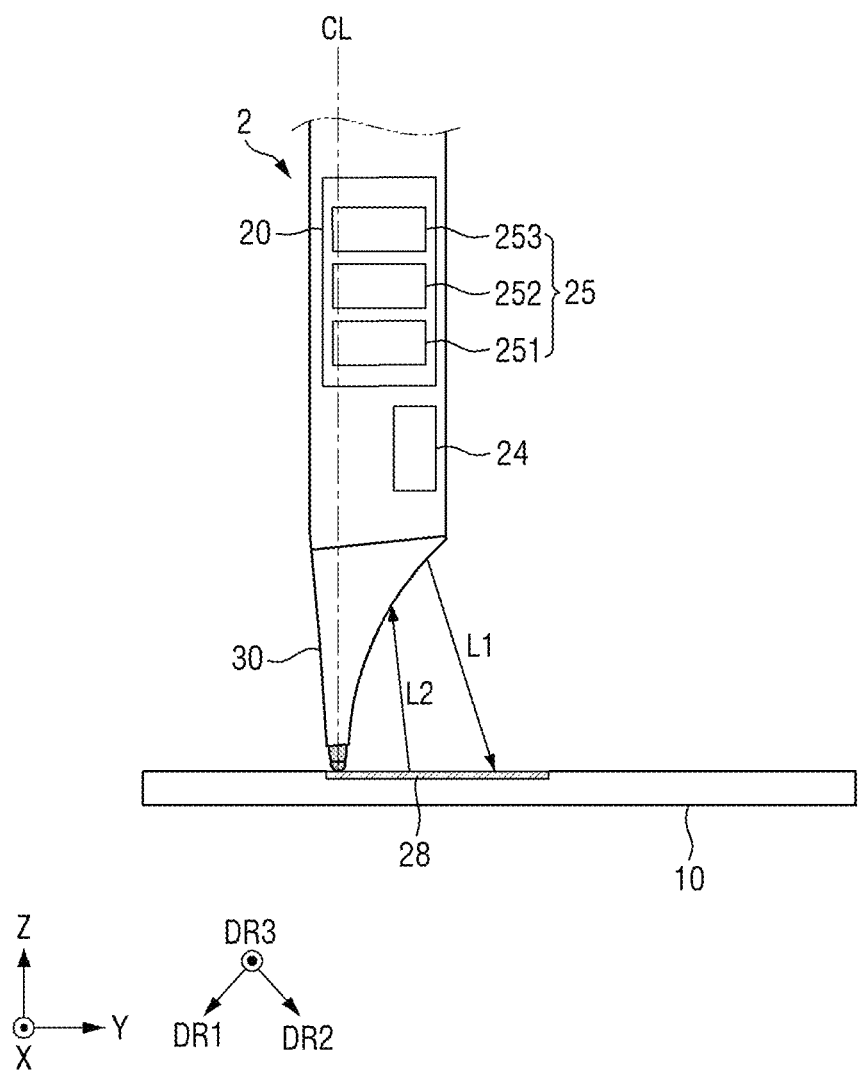
FIG. 12 is a cross-sectional view illustrating the position sensing method of the touch sensing system according to an embodiment.

The light receiving portion 25 may include a lens system (251 in FIG. 12), a barrel unit (252 in FIG. 12), and an image sensor unit (253 in FIG. 12). For example, the barrel unit may be a lens barrel and the image sensor unit may be an image sensor.

The lens system 251 may focus infrared rays and transmit an infrared image to the barrel unit 252. The barrel unit 252 may provide a space for transmitting the focused infrared image from the lens system 251 to the image sensor unit 253. In addition, the barrel unit 252 may focus the infrared image so that the image sensor unit 253 may recognize the infrared image. The optical image sensor unit 253 may convert the optical image formed by the lens system 251 into an electrical image signal and output the image signal.

Like the infrared LED array, the image sensor unit 253 may be configured as an array having a matrix structure to provide image data of the code patterns to a code processor 262 according to an infrared shape reflected from the code patterns of the code pattern unit. In this way, the light receiving portion 25 of the position input device 2 may continuously detect the code pattern units included in some areas of the touch sensing unit TSU according to the user's control and motion, and continuously generate shape data of the code patterns to provide the generated shape data to the code processor 262.

The light transmitting layer may be disposed on one side of the light receiving portion 25 and the light emitting portion 24. The light transmitting layer may block wavelength bands other than infrared rays and allow infrared rays to pass therethrough.

The control unit (e.g., a control circuit) may include the code processor 262, the communication module 263, and the memory 264.

The code processor 262 may determine a time point at which a pressurization sensing signal is input as a time point at which the position input device 2 is used. When the pressurization sensing signal is input, the code processor 262 may continuously receive the image data of the code pattern unit from the light receiving portion 25. For example, the code processor 262 may continuously receive the image data for the code patterns included in the code pattern unit, and identify the structure and shape of the code patterns. The code processor 262 may extract or generate data codes corresponding to the structure and shape of the code patterns, and may extract or generate coordinate data corresponding to combined data code determined from combining the data codes. The code processor 262 may transmit the generated coordinate data to the display device 10 through the communication module 263. In particular, the code processor 262 may receive the image data of the code pattern unit to generate and convert the data codes corresponding to the code patterns, respectively, thereby quickly generating the coordinate data without complicated calculation and correction.

The communication module 263 may perform wired/wireless communication with an external device. For example, the communication module 263 may transmit and receive communication signals to and from the communication unit 160 of the display device 10. The communication module 263 may receive the coordinate data including the data codes from the code processor 262, and may provide the coordinate data to the communication unit 160.

The memory 264 may store data necessary for driving the position input device 2. The memory 264 may store image data of the code patterns and the data codes respectively corresponding to the respective image data and code patterns. In addition, the memory 264 may store the data codes and the coordinate data according to the combination of data codes. The memory 264 may share the data codes respectively corresponding to the respective image data and code patterns, and the coordinate data according to the combination of the data codes with the code processor 262. Accordingly, the code processor 262 may combine the data codes through the data codes and the coordinate data stored in the memory 264, and may extract or generate coordinate data corresponding to the combined data code.

Figure 3:
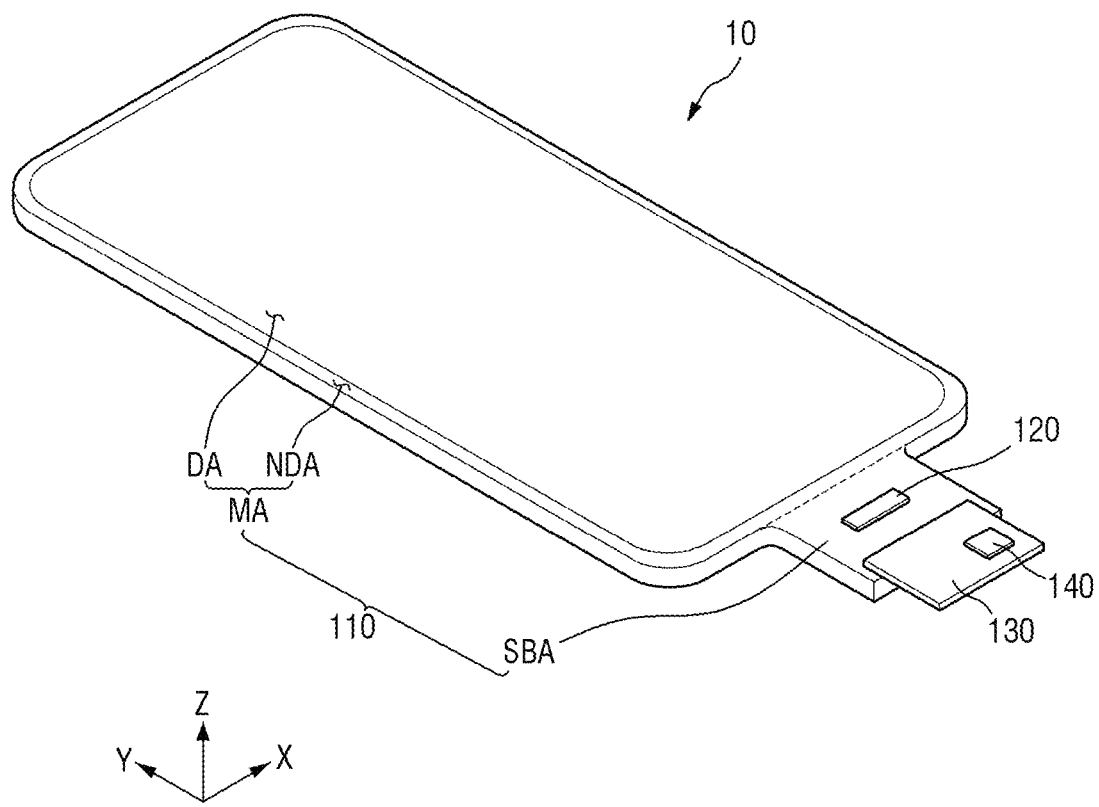
FIG. 3 is a perspective view illustrating the display device according to an embodiment.

FIG. 3 is a perspective view illustrating the display device according to an embodiment.

Referring to FIG. 3, the display device 10 may be applied to portable electronic devices such as a mobile phone, a smartphone, a tablet personal computer (PC), a mobile communication terminal, an electronic notebook, an electronic book, a portable multimedia player (PMP), navigation, and an ultra mobile PC (UMPC). For example, the display device 10 may be applied to a display unit of a television, a laptop computer, a monitor, an electronic billboard, or an Internet of Things (JOT). As another example, the display device 10 may be applied to a wearable device such as a smart watch, a watch phone, a glasses-type display, and a head mounted display (HMD). As still another example, the display device 10 may be applied to an instrument panel of a vehicle, a center fascia of a vehicle, a center information display (CID) disposed on a dashboard of a vehicle, a room mirror display substituting for a side mirror of a vehicle, or a display disposed on a rear surface of a front seat as entertainment for a rear seat of a vehicle.

The display device 10 may have a planar shape similar to a quadrangle. For example, the display device 10 may have a planar shape similar to a quadrangle having a short side in a first direction X and a long side in a second direction Y. A corner where the short side in the first direction X and the long side in the second direction Y meet may be rounded to have a predetermined curvature or may be formed at a right angle. The planar shape of the display device 10 is not limited to the quadrangle, and may be formed similarly to other polygons, circles, or ovals.

The display device 10 may include the display panel 110, the display driving unit 120, a circuit board 130, and the touch driving unit 140.

The display panel 110 may include a main area MA and a sub-area SBA.

The main area MA may include a display area DA including pixels displaying an image, and a non-display area NDA disposed around the display area DA. The display area DA may emit light from a plurality of light emitting areas or a plurality of opening areas. For example, the display panel 110 may include a pixel circuit including switching elements, a pixel defining film defining the light emitting area or the opening area, and a self-light emitting element.

The non-display area NDA may be an area outside the display area DA. The non-display area NDA may be defined as an edge area of the main area MA of the display panel 110. The non-display area NDA may include a gate driving unit (e.g., see 121 in FIG. 21) supplying gate signals to gate lines, and fan-out lines (e.g., FOL in FIG. 21) connecting the display driving unit 120 and the display area DA.

The sub-area SBA may extend from one side of the main area MA. The sub-area SBA may include a flexible material that may be bent, folded, rolled, or the like. For example, when the sub-area SBA is bent, the sub-area SBA may overlap the main area MA in a thickness direction (a third direction Z). The sub-area SBA may include the display driving unit 120 and a pad portion connected to a circuit board 130. Optionally, the sub-area SBA may be omitted, and the display driving unit 120 and the pad portion may be disposed in the non-display area NDA.

The display driving unit 120 may output signals and voltages for driving the display panel 110. The display driving unit 120 may supply data voltages to data lines. The display driving unit 120 may supply a power voltage to a power line and may supply gate control signals to the gate driving unit (e.g., 121 in FIG. 21). The display driving unit 120 may be formed as an integrated circuit (IC) and mounted on the display panel 110 by a chip on glass (COG) method, a chip on plastic (COP) method, or an ultrasonic bonding method. For example, the display driving unit 120 may be disposed in the sub-area SBA, and may overlap the main area MA in the thickness direction (third direction Z) by bending of the sub-area SBA. As another example, the display driving unit 120 may be mounted on the circuit board 130.

The circuit board 130 may be attached to the pad portion of the display panel 110 using an anisotropic conductive film (ACF). Lead lines of the circuit board 130 may be electrically connected to a pad portion of the display panel 110. The circuit board 130 may be a flexible film such as a flexible printed circuit board, a printed circuit board, or a chip on film.

The touch driving unit 140 may be mounted on the circuit board 130. The touch driving unit 140 may be connected to the touch sensing unit TSU of the display panel 110. The touch driving unit 140 may supply a touch driving signal to the plurality of touch electrodes of the touch sensing unit TSU, and may sense an amount of change in capacitance between the plurality of touch electrodes. For example, the touch driving signal may be a pulse signal having a predetermined frequency. The touch driving unit 140 may calculate whether a touch input has occurred and touch coordinates based on the amount of change in capacitance between the plurality of touch electrodes. The touch driving unit 140 may be formed as an integrated circuit (IC).

Figure 4:
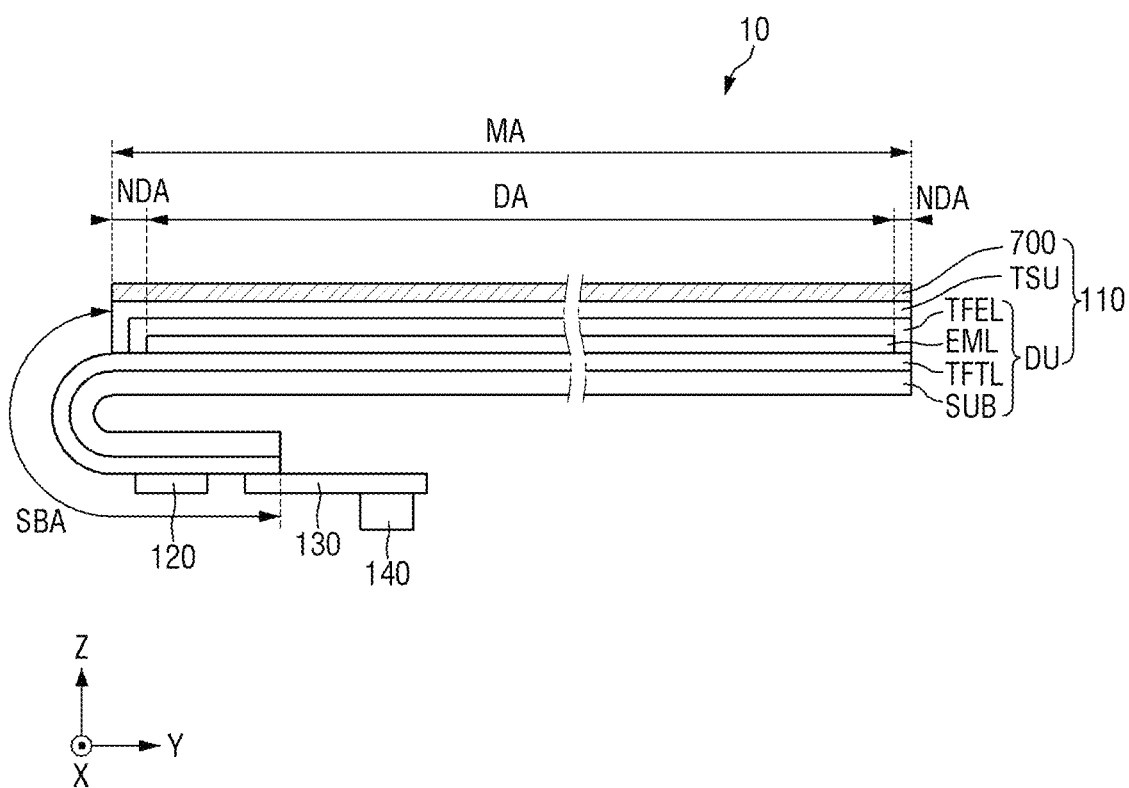
FIG. 4 is a schematic cross-sectional view illustrating the display device according to an embodiment.
Figure 5:
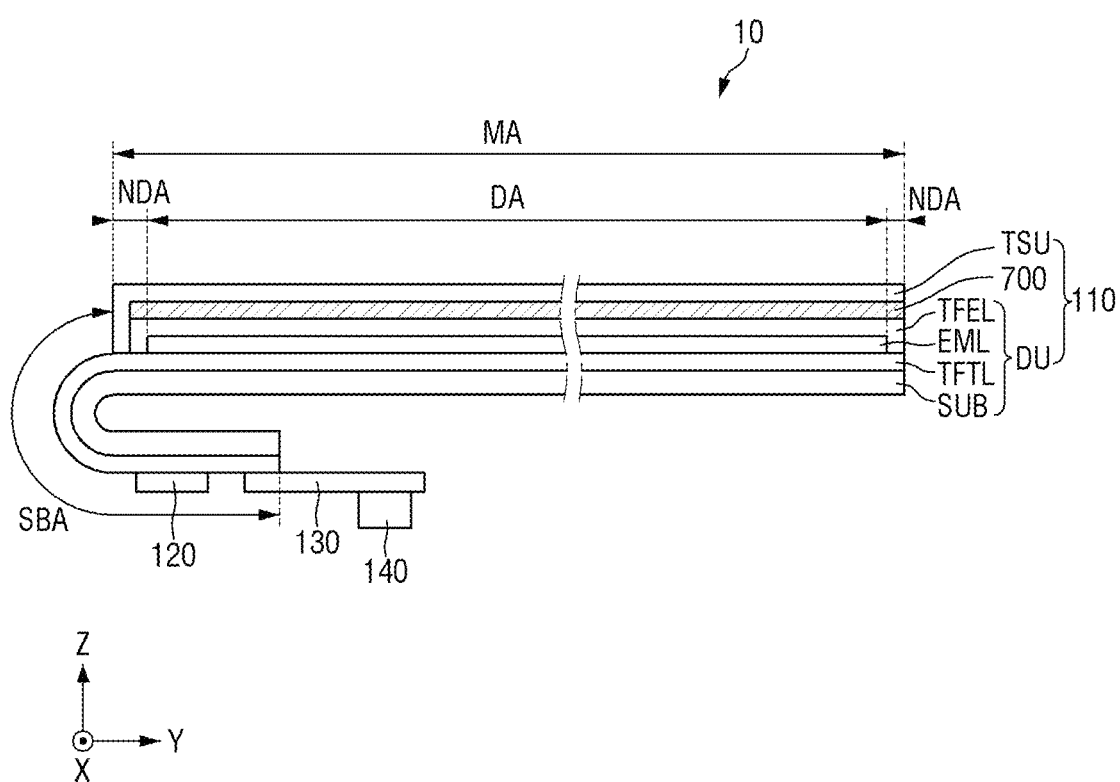
FIGS. 5 and 6 are schematic cross-sectional views of the display device according to an embodiment.
Figure 6:
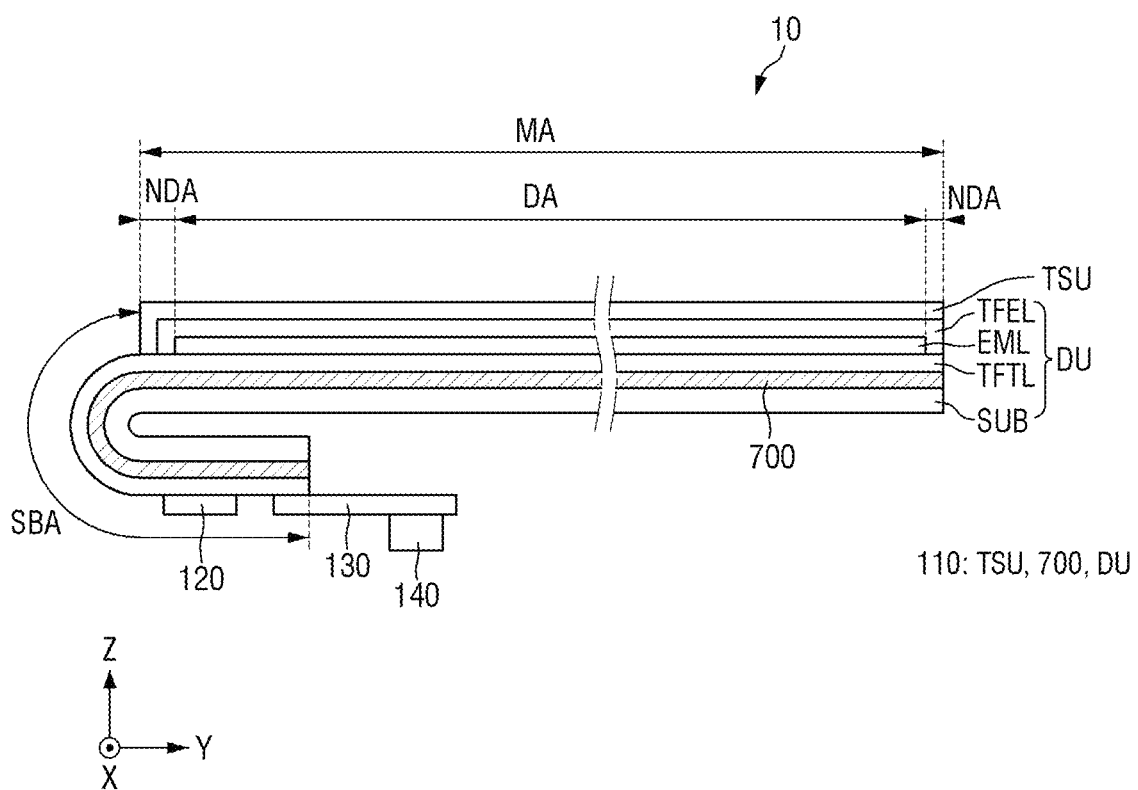

FIG. 4 is a schematic cross-sectional view illustrating the display device according to an embodiment. FIGS. 5 and 6 are schematic cross-sectional views of the display device according to another embodiment.

Referring to FIG. 4, the display panel 110 may include the display unit DU and the touch sensing unit TSU. The display unit DU may further include a reflective layer 700, a substrate SUB, a thin film transistor layer TFTL, a light emitting element layer EML, and an encapsulation layer TFEL.

The substrate SUB may be a base substrate or a base member. The substrate SUB may be a flexible substrate that may be bent, folded, rolled, or the like. For example, the substrate SUB may include a glass material or a metal material, but is not limited thereto. As another example, the substrate SUB may include a polymer resin such as polyimide PI.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines (e.g., see FOL in FIG. 21) connecting the display driving unit 120 and the data lines, and lead lines connecting the display driving unit 120 and the pad portion. Each of the thin film transistors may include a semiconductor area, a source electrode, a drain electrode, and a gate electrode. For example, when the gate driving unit 121 is formed on one side of the non-display area NDA of the display panel 110, the gate driving unit 121 may include the thin film transistors.

The thin film transistor layer TFTL may be disposed in the display area DA, the non-display area NDA, and the sub-area SBA. The thin film transistors, the gate lines, the data lines, and the power lines of each of the pixels of the thin film transistor layer TFTL may be disposed in the display area DA. The gate control lines and the fan-out lines (e.g., see FOL in FIG. 21) of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining film defining pixels. The plurality of light emitting elements of the light emitting element layer EML may be disposed in the display area DA.

For example, the light emitting layer may be an organic light emitting layer including an organic material. The light emitting layer may include a hole transporting layer, an organic light emitting layer, and an electron transporting layer. When the first electrode receives a predetermined voltage through the thin film transistor of the thin film transistor layer TFTL, and the second electrode receives a cathode voltage, holes and electrons may move to the organic light emitting layer through the hole transporting layer and the electron transporting layer, respectively, and may be combined with each other in the organic light emitting layer to emit light. For example, the first electrode may be an anode electrode and the second electrode may be a cathode electrode, but the disclosure is not limited thereto.

As another example, the plurality of light emitting elements may include a quantum dot light emitting diode including a quantum dot light emitting layer or an inorganic light emitting diode including an inorganic semiconductor.

The encapsulation layer TFEL may cover an upper surface and side surfaces of the light emitting element layer EML, and may protect the light emitting element layer EML. The encapsulation layer TFEL may include at least one inorganic film and at least one organic film for encapsulating the light emitting element layer EML.

The touch sensing unit TSU may be disposed on the encapsulation layer TFEL. The touch sensing unit TSU may include a plurality of touch electrodes for sensing a user's touch in a capacitive method, and touch lines connecting the plurality of touch electrodes and the touch driving unit 140. For example, the touch sensing unit TSU may sense a user's touch in a self-capacitance method or a mutual capacitance method.

As another example, the touch sensing unit TSU may be disposed on a separate substrate disposed on the display unit DU. In this case, the substrate supporting the touch sensing unit TSU may be a base member that encapsulates the display unit DU.

The plurality of touch electrodes of the touch sensing unit TSU may be disposed in a touch sensor area overlapping the display area DA. The touch lines of the touch sensing unit TSU may be disposed in a touch peripheral area overlapping the non-display area NDA.

The reflective layer 700 is disposed on an upper surface of the touch sensing unit TSU. The reflective layer 700 serves to reflect external light. For example, when external light is incident on the display device 10, a portion of the external light may be reflected by the reflective layer 700, and another portion of light may transmit through the reflective layer 700 and be reflected by the code pattern unit (CDP in FIG. 7). In addition, the light reflected by the code pattern unit (CDP in FIG. 7) may be reflected again by the reflective layer 700. Accordingly, the reflected light may be sensed by the position input device 2, and a position may be sensed from the sensed reflect light. A method by which the code pattern unit (CDP in FIG. 7) senses the user's position will be described later with reference to FIG. 11.

The reflective layer 700 may be in the form of a film. The reflective layer 700 may be attached to a lower surface of the substrate by an optically clear adhesive (OCA) film or an optically clear resin (OCR). For example, the reflective layer 700 may include a cholesteric liquid crystal layer (CD in FIG. 8) and alignment plates. The alignment plates and the cholesteric liquid crystal layer (CD in FIG. 8) may be sequentially stacked on the upper surface of the touch sensing unit TSU.

The reflective layer 700 may be directly formed in the display panel 110. In an embodiment, the reflective layer 700 may be internalized in the display panel 110 together with the thin film transistor layer TFTL, the light emitting element layer EML, the encapsulation layer TFEL, and the touch sensing unit TSU. In this case, the reflective layer 700 is positioned on a light emission path of the light emitting element layer EML. In an embodiment, the reflective layer 700 has some degree of transparency to prevent a display screen from being blocked or a luminance from being lowered.

The sub-area SBA of the display panel 110 may extend from one side of the main area MA. The sub-area SBA may include a flexible material that may be bent, folded, rolled, or the like. For example, when the sub-area SBA is bent, the sub-area SBA may overlap the main area MA in a thickness direction (a third direction Z). The sub-area SBA may include the display driving unit 120 and a pad portion connected to a circuit board 130.

FIG. 5 is a schematic cross-sectional view illustrating the display device according to an embodiment.

Referring to FIG. 5, the embodiment is different from the embodiment of FIG. 4 in that the reflective layer 700 is disposed on a lower surface of the touch sensing unit TSU.

Referring to FIG. 5, the reflective layer 700 may be in the form of a film. The reflective layer 700 may be attached to a lower surface of the substrate by an optically clear adhesive (OCA) film or an optically clear resin (OCR). For example, the reflective layer 700 may include a cholesteric liquid crystal layer (CD in FIG. 8) and alignment plates. The alignment plates and the cholesteric liquid crystal layer 710 may be sequentially stacked on the lower surface of the substrate.

The reflective layer 700 may be directly formed the display panel 110. In an embodiment, the reflective layer 700 may be internalized in the display panel 110 together with the thin film transistor layer TFTL, the light emitting element layer EML, the encapsulation layer TFEL, and the touch sensing unit TSU. In this case, the reflective layer 700 is positioned on a light emission path of the light emitting element layer EML. In an embodiment, the reflective layer 700 has some degree of transparency to prevent a display screen from being blocked or a luminance from being lowered.

FIG. 6 is a schematic cross-sectional view illustrating the display device according to an embodiment.

Referring to FIG. 6, the embodiment is different from the embodiment of FIG. 4 in that the reflective layer 700 is disposed on the thin film transistor layer TFTL.

Referring to FIG. 6, the reflective layer 700 may be in the form of a film. The reflective layer 700 may be attached to an upper surface of the substrate by an optically clear adhesive (OCA) film or an optically clear resin (OCR). For example, the reflective layer 700 may include a cholesteric liquid crystal layer (CD in FIG. 8) and alignment plates. The alignment plates and the cholesteric liquid crystal layer (CD in FIG. 8) may be sequentially stacked on the lower surface of the substrate.

The reflective layer 700 may be directly formed in the display panel 110. In this case, the reflective layer 700 may be internalized in the display panel 110 together with the thin film transistor layer TFTL, the light emitting element layer EML, the encapsulation layer TFEL, and the touch sensing unit TSU. In this case, the reflective layer 700 is not positioned on a light emission path of the light emitting element layer EML. Therefore, the reflective layer 700 may include an opaque material because it is not necessary to prevent a display screen from being blocked or a luminance from being lowered.

As such, even in this embodiment, the reflective layer 700 may be disposed adjacent to the touch sensing unit TSU. When the reflective layer 700 reflects external light, and the reflected light is reflected back by the code pattern unit CDP of the touch sensing unit TSU, a length of an optical path may be reduced. That is, a reflection efficiency of the reflective layer 700 may increase.

Figure 7:
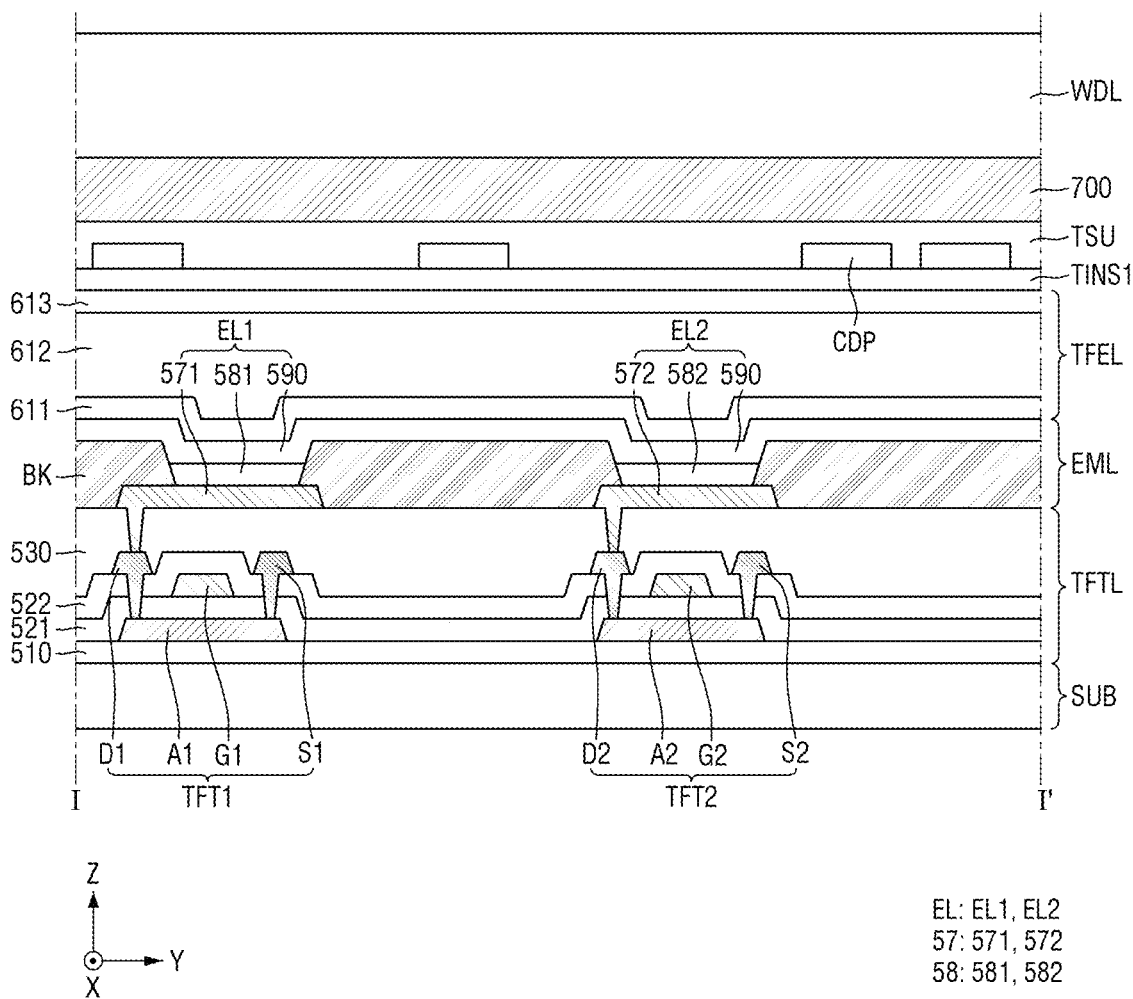
FIG. 7 is a cross-sectional view illustrating the display device according to an embodiment.
Figure 8:
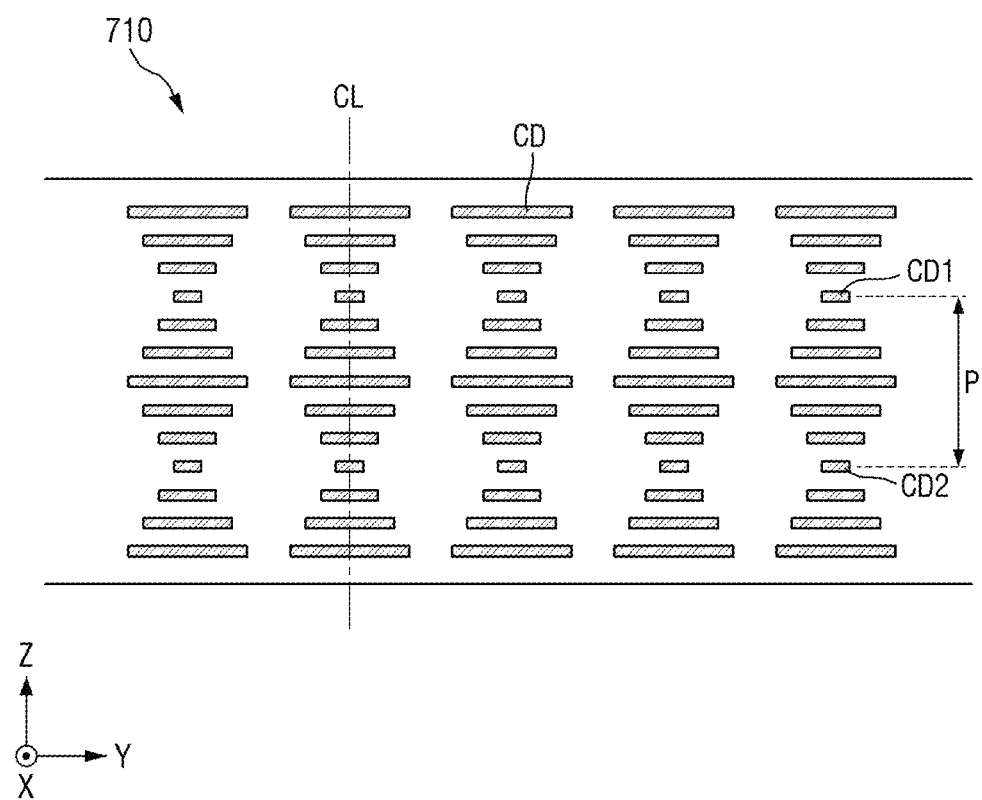
FIG. 8 is an enlarged cross-sectional view of a reflective layer of FIG. 7.
Figure 9:
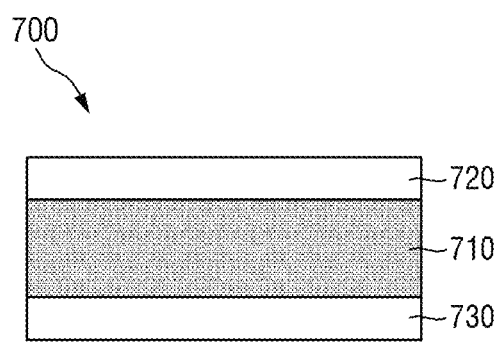
FIGS. 9 and 10 are cross-sectional views of a reflective layer according to an embodiment.
Figure 10:
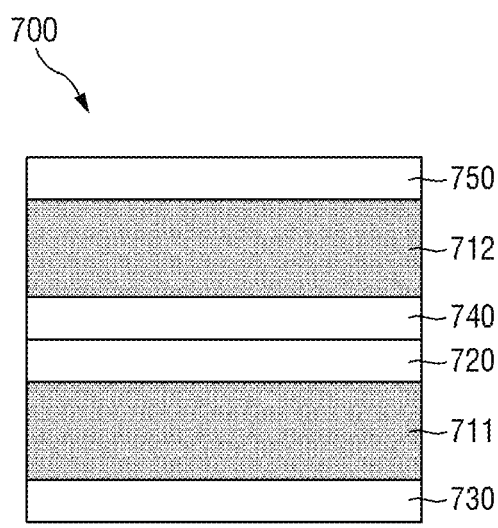

FIG. 7 is a cross-sectional view illustrating the display device according to an embodiment. FIG. 8 is an enlarged cross-sectional view of a reflective layer of FIG. 7. FIGS. 9 and 10 are cross-sectional views of a reflective layer according to an embodiment.

Referring to FIG. 7, a buffer layer 510 is disposed on a substrate SUB. The buffer layer 510 may include silicon nitride, silicon oxide, or silicon oxynitride.

A first thin film transistor TFT1 and a second thin film transistor TFT2 may be disposed on the buffer layer 510.

A plurality of thin film transistors TFT1 and TFT2 may include semiconductor layers A1 and A2, a gate insulating layer 521 disposed on a portion of the semiconductor layers A1 and A2, gate electrodes G1 and G2 on the gate insulating layer 521, an interlayer insulating film 522 covering each of the semiconductor layers A1 and A2 and each of the gate electrodes G1 and G2, and source electrodes S1 and S2 and drain electrodes D1 and D2 on the interlayer insulating film 522, respectively.

The semiconductor layers A1 and A2 may form channels of the first thin film transistor TFT1 and the second thin film transistor TFT2, respectively. The semiconductor layers A1 and A2 may include polycrystalline silicon. In an embodiment, the semiconductor layers A1 and A2 may include single crystal silicon, low temperature polycrystalline silicon, amorphous silicon, or an oxide semiconductor. The oxide semiconductor may include a binary compound (ABx), a ternary compound (ABxCy), and a quaternary compound (ABxCyDz) containing, for example, indium, zinc, gallium, tin, titanium, aluminum, hafnium (Hf), zirconium (Zr), magnesium (Mg), and the like. Each of the semiconductor layers A1 and A2 may include a channel region, and a source region and a drain region doped with impurities.

The gate insulating layer 521 is disposed on the semiconductor layers A1 and A2. The gate insulating layer 521 electrically insulates a first gate electrode G1 from a first semiconductor layer A1 and electrically insulates a second gate electrode G2 from a second semiconductor layer A2. The gate insulating layer 521 may be formed of an insulating material, for example, silicon oxide (SiOx), silicon nitride (SiNx), or metal oxide.

The first gate electrode G1 of the first thin film transistor TFT1 and the second gate electrode G2 of the second thin film transistor TFT2 are disposed on the gate insulating layer 521. The gate electrodes G1 and G2 may be formed at positions overlapping the channel regions on an upper portion of the channel regions of the semiconductor layers A1 and A2, that is, on the gate insulating layer 521, respectively.

The interlayer insulating film 522 may be disposed on the gate electrodes G1 and G2. The interlayer insulating film 522 may include an inorganic insulating material such as silicon oxide (SiOx), silicon nitride (SiNx), silicon oxynitride, hafnium oxide, or aluminum oxide. In addition, the interlayer insulating film 522 may include a plurality of insulating films, and may further include a conductive layer forming a second electrode of a capacitor between the insulating films.

The source electrodes S1 and S2 and the drain electrodes D1 and D2 are disposed on the interlayer insulating film 522. A first source electrode S1 of the first thin film transistor TFT1 may be electrically connected to a drain region of the first semiconductor layer A1 through a contact hole penetrating through the interlayer insulating film 522 and the gate insulating layer 521. A second source electrode S2 of the second thin film transistor TFT2 may be electrically connected to a drain region of the second semiconductor layer A2 through a contact hole penetrating through the interlayer insulating film 522 and the gate insulating layer 521. Each of the source electrodes S1 and S2 and the drain electrodes D1 and D2 may include one or more metals selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A planarization layer 530 may be formed on the interlayer insulating film 522 to cover each of the source electrodes S1 and S2 and the drain electrodes D1 and D2. The planarization layer 530 may be formed of an organic insulating material or the like. The planarization layer 530 may have a flat surface and may include a contact hole exposing one of the source electrodes S1 and S2 and the drain electrodes D1 and D2, respectively.

The light emitting element layer EML may be disposed on the planarization layer 530. The light emitting element layer EML may include a light emitting element EL and a bank layer BK. The light emitting element EL may include a pixel electrode 57, a light emitting layer 58, and a common electrode 590.

The pixel electrode 57 of the light emitting element EL may be disposed on the planarization layer 530. The pixel electrode 57 may be provided for each pixel SP. For example, a first pixel electrode 571 of a first light emitting element EL1 and a second pixel electrode 572 of a second light emitting element EL2 may be disposed on the planarization layer 530. The first pixel electrode 571 may be connected to the first source electrode S1 or the first drain electrode D1 of the first thin film transistor TFT1 through a contact hole penetrating through the planarization layer 530. In addition, the second pixel electrode 572 may be connected to the second source electrode S2 or the second drain electrode D2 of the second thin film transistor TFT2 through a contact hole penetrating through the planarization layer 530.

The pixel electrode 57 of the light emitting element EL is not limited thereto, but may have a single layer structure of molybdenum (Mo), titanium (Ti), copper (Cu), or aluminum (Al), or may have a stacked layer structure, for example, a multilayer structure of indium-tin-oxide (ITO), indium-zinc-oxide (IZO), zinc oxide (ZnO), indium oxide ($In_2O_3$), and ITO/Mg, ITO/MgF, ITO/Ag, and ITO/Ag/ITO containing silver (Ag), magnesium (Mg), aluminum (Al), platinum (Pt), lead (Pb), gold (Au), and nickel (Ni).

A bank layer BK may be disposed on the pixel electrode 57. The bank layer BK may be formed in an area overlapping the pixel electrode 57 to form an opening exposing the pixel electrode 57. An area in which the exposed pixel electrode 57 and the light emitting layer 58 overlap may be defined as a light emitting area emitting different light according to each of the pixels SP.

The bank layer BK may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). As another example, the bank layer BK may also include an inorganic material such as silicon nitride.

The light emitting layer 58 may be disposed on the pixel electrode 57 of the light emitting element EL exposed by the opening of the bank layer BK. The light emitting layer 58 may include a high molecular material or a low molecular material, and may emit red, green, or blue light for each pixel SP. The light emitted from the light emitting layer 58 may contribute to image display or function as a light source of light incident on an optical sensor.

When the light emitting layer 58 is formed of an organic material, a hole injecting layer HIL and a hole transporting layer HTL may be disposed on a lower side of each light emitting layer 58 at a center, and an electron injecting layer EIL and an electron transporting layer ETL may be stacked on an upper side of each light emitting layer 58 at a center. These layers may be a single layer or multiple layers made of an organic material.

The common electrode 590 may be disposed on the light emitting layer 58 and the bank layer BK. The common electrode 590 may be disposed across all of the plurality of pixels SP and a plurality of optical sensors in a form covering the light emitting layer 58 and the bank layer BK. The common electrode 590 may include a conductive material having a low work function, for example, Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg, etc.). Alternatively, the common electrode 590 may include a transparent metal oxide, for example, indium-tin-oxide (ITO), indium-zinc-oxide (IZO), or zinc oxide (ZnO).

Although not limited thereto, the common electrode 590 may be commonly disposed on the light emitting layer 58. In this case, a cathode electrode of the first light emitting element EL1 and a sensing cathode electrode of the second light emitting element EL2 may be electrically connected to each other. For example, a common voltage line connected to the cathode electrode of the first light emitting element EL1 may be simultaneously connected to a cathode electrode of the second light emitting element EL2.

The encapsulation layer TFEL may be disposed on an upper side of the light emitting element layer EML. The encapsulation layer TFEL may include at least one inorganic film to prevent oxygen or moisture from permeating into each of the light emitting layers 58. In addition, the encapsulation layer TFEL may include at least one organic film to protect each of the light emitting layers 58 from foreign substances such as dust. For example, the encapsulation layer TFEL may be formed in a structure in which a first inorganic film 611, an organic film 612, and a second inorganic film 613 are sequentially stacked. The first inorganic film 611 and the second inorganic film 613 may be formed of multiple films in which one or more inorganic films of a silicon nitride layer, a silicon oxynitride layer, a silicon oxide layer, a titanium oxide layer, and an aluminum oxide layer are alternately stacked. The organic film 612 may be an organic film made of an acryl resin, an epoxy resin, a phenolic resin, a polyamide resin, a polyimide resin, or the like.

The touch sensing unit TSU may be disposed on the encapsulation layer TFEL. The touch sensing unit TSU may include a plurality of electrodes. For example, the touch sensing unit TSU may include a plurality of touch electrodes SEN and a plurality of dummy electrodes DME (see FIG. 22). The plurality of touch electrodes SEN may form mutual capacitance or self capacitance to sense a touch of an object or a person. The plurality of touch electrodes SEN may include a plurality of driving electrodes TE and a plurality of sensing electrodes RE.

Figure 22:
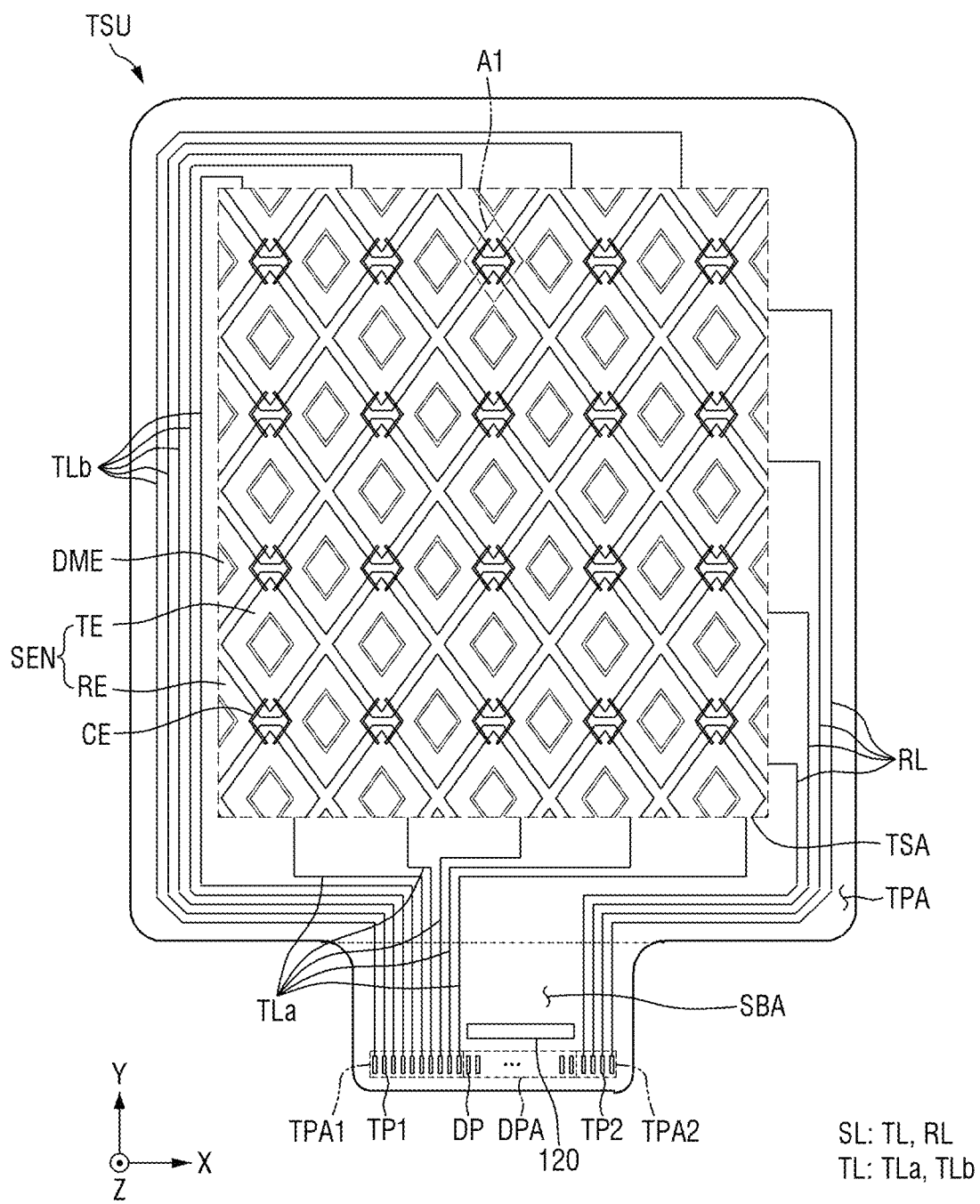
FIG. 22 is a plan view illustrating a touch sensing unit of the display device according to an embodiment.
Figure 23:
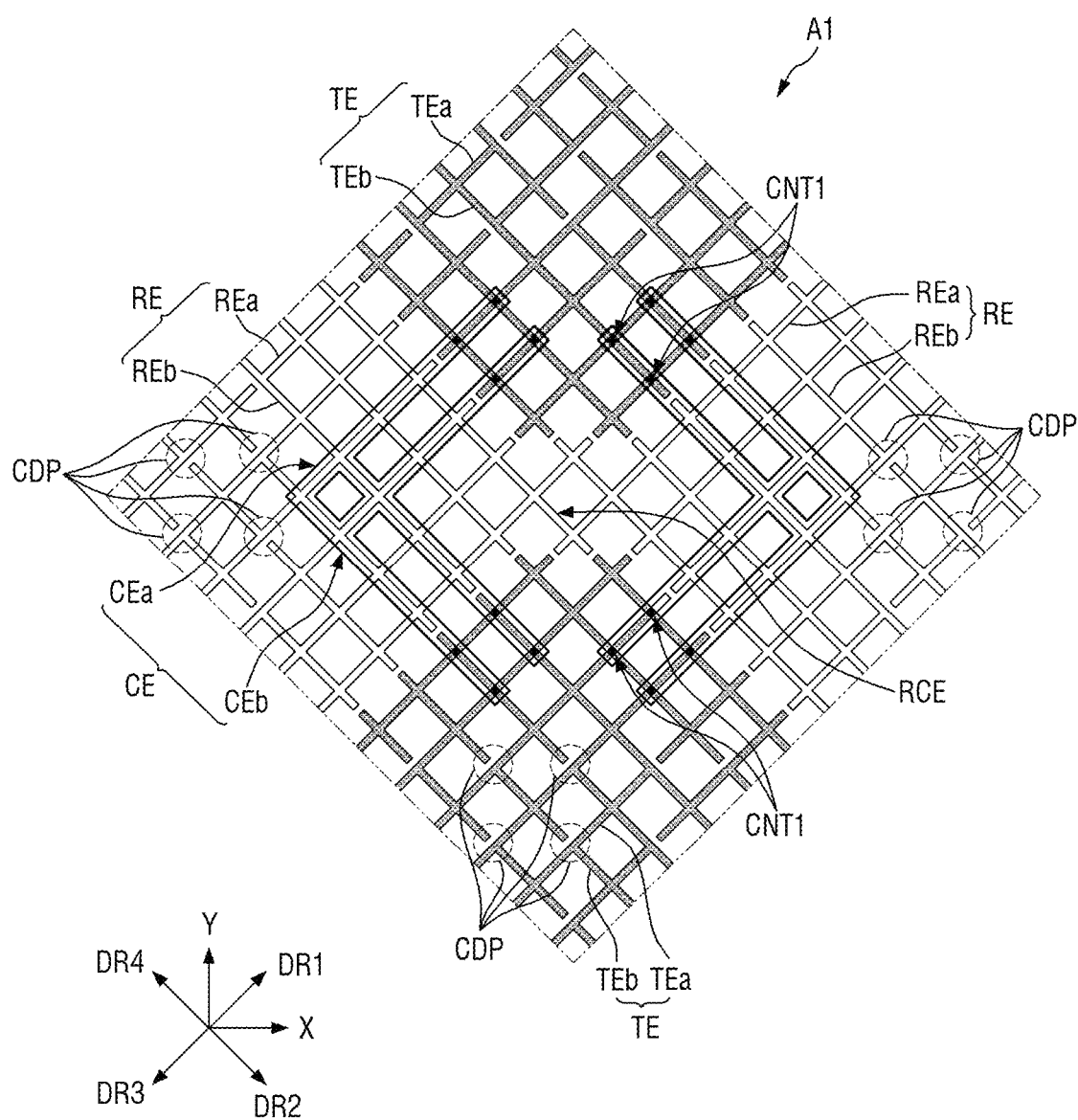
FIG. 23 is an enlarged view of area A1 illustrated in FIG. 22.

In addition, at least some of the plurality of touch electrodes SEN may include a code pattern unit CDP (e.g., see FIG. 23). At least some of the plurality of driving electrodes TE or at least some of the plurality of sensing electrodes RE may include a code pattern unit CDP. The code pattern unit CDP may include a plurality of code patterns cut according to a specific criterion and having position information. The plurality of touch electrodes SEN, the plurality of dummy electrodes DME, and the code pattern unit CDP of the touch sensing unit TSU will be described later with reference to FIG. 22 and FIG. 23.

A reflective layer 700 may be disposed on the touch sensing unit TSU.

Referring further to FIG. 8, the reflective layer 700 may include at least a liquid crystal layer 710. In an embodiment, the liquid crystal layer 710 is a cholesteric liquid layer. For example, the liquid crystal layer 710 may include a chiral dopant that induces a periodic helical structure in the cholesteric liquid crystal (CD). The cholesteric liquid crystal (CD) may be referred to as a chiral nematic liquid crystal. Optical properties of the liquid crystal layer 710 may be determined according to a rotation direction of a helical structure in which the cholesteric liquid crystal CD is twisted and rotated.

In an embodiment, the liquid crystal layer 710 has a helical structure in which a chiral dopant (or liquid crystal molecules) of the cholesteric liquid crystal (CD) is twisted along a helical axis and arranged in layers. A distance to a second chiral dopant CD2 rotated 360° in a helical axis direction with respect to a first chiral dopant CD1 may be defined as a pitch P of the liquid crystal layer 710. That is, the pitch P may be a distance between the first chiral dopant CD1 and the second chiral dopant CD2 in the third direction Z. Alternatively, the helical axis CL of the liquid crystal layer 710 may extend in the third direction Z, and the pitch P may be a distance between the first chiral dopant CD1 and the second chiral dopant CD2 in the third direction Z on the helical axis CL.

Accordingly, the cholesteric liquid crystals CD arranged in the helical structure by the chiral dopant reflect light of a long wavelength as the pitch P increases, and reflect light of a short wavelength as the pitch P decreases. That is, depending on how the pitch P of the cholesteric liquid crystals CD arranged in the helical structure by the chiral dopant is designed, it is possible to determine which wavelength of light is reflected. The pitch P of the cholesteric liquid crystals CD arranged in the helical structure by the chiral dopant may be adjusted according to an amount of the chiral dopant.

In an embodiment, the liquid crystal layer 710 transmits only a portion of light polarized in a direction opposite to the helical rotation direction and reflects the remaining light. A wavelength of the reflected light may be expressed as a product of an average refractive index of the cholesteric liquid crystals CD and the pitch (P).

Even if a liquid crystal composition is prepared to orient the liquid crystal layer 710 having a desired pitch, a liquid crystal molecule group is oriented to have a pitch in a predetermined range because a combination of liquid crystal molecules in the liquid crystal molecule group constituting the pitch is randomly determined. In addition, since each of the liquid crystal molecules has a refractive index within a predetermined range, and the combination of liquid crystal molecules constituting one pitch is randomly determined, the average refractive index of the liquid crystal molecule group constituting one pitch may be different for each pitch.

The liquid crystal layer 710 is oriented to have a refractive index in a predetermined range and a pitch in a predetermined range. When a refractive index range of the liquid crystal layer 710 is wide and a pitch range thereof is wide, light of a wide wavelength band may be reflected. A wavelength band of reflected light reflected from the liquid crystal layer 710 including a plurality of liquid crystal molecule groups having different pitches is determined as expressed in Equation 1 below.

$$P = \frac{\lambda}{n} \qquad \text{[Equation 1]}$$

In Equation 1, P denotes a pitch of the cholesteric liquid crystals CD arranged in the helical structure by the chiral dopant, λ denotes a reflection wavelength at which light is reflected, and n denotes an average refractive index of the cholesteric liquid crystals CD. For example, when the reflection wavelength λ is 780 nm and the average refractive index n of the cholesteric liquid crystals CD is 1.5, the pitch P of the cholesteric liquid crystals CD arranged in the helical structure by the chiral dopant may be calculated to be 520 nm. In addition, when the reflection wavelength λ is 380 nm and the average refractive index n of the cholesteric liquid crystals CD is 1.5, the pitch P of the cholesteric liquid crystals CD arranged in the helical structure by the chiral dopant may be calculated to be 253 nm. That is, when the refractive index n of the cholesteric liquid crystal CD is 1.5, the pitch P may be designed to be 253 nm or less or 520 nm or more so that the reflection wavelength λ of the cholesteric liquid crystals CD arranged in the helical structure by the chiral dopant is 380 nm or less and 780 nm or more in order to reflect an infrared wavelength band (a wavelength band of 780 nm or more) or an ultraviolet wavelength band (a wavelength band of 380 nm or less).

To orient the cholesteric liquid crystal CD in a more planar shape, the reflective layer 700 may further include orientation films 720 and 730. For example, as illustrated in FIG. 8, the liquid crystal layer 710 may be aligned between a first orientation film 730 and a second orientation film. The orientation film may be a polyimide film, and the cholesteric liquid crystal may be oriented on a rubbed polyimide film.

In FIG. 9, a film-type liquid crystal layer 710 is oriented on the first orientation film 730, and the second orientation film 720 is disposed on the liquid crystal layer 710. A liquid crystal composition of the liquid crystal layer 710 in a liquid state is coated on one surface of the first orientation film 730 and is then primarily cured, and a coating layer may be thermally cured in an oven at 80° C. for 5 minutes. Thereafter, secondary curing is performed using a UV light source. Accordingly, the chiral dopant in the liquid crystal layer 710 may be fixed to have a predetermined pitch P and a helical axis CL.

Referring further to FIG. 10, the reflective layer 700 may include a plurality of liquid crystal layers 710. For example, the reflective layer 700 may include a first liquid crystal layer 711 and a second liquid crystal layer 712. To orient the first liquid crystal layer 710, a first orientation film 730 and a second orientation film 720 may be disposed on one surface and the other surface of the first liquid crystal layer 710, respectively. In addition, in order to orient the second liquid crystal layer 710, a third orientation film 740 and a fourth orientation film 750 may be disposed on one surface and the other surface of the first liquid crystal layer 710, respectively. However, the number of liquid crystal layers 710 of the reflective layer 700 is not limited thereto, and may be freely designed according to the wavelength band of the reflected light.

The reflective layer 700 may have a reflectance that is a ratio of reflecting light to incident external light. For example, the reflectance of the reflective layer 700 may be 10% to 50%. A detailed description thereof will be provided below with reference to FIG. 17.

Referring back to FIG. 7, a window WDL may be disposed on the reflective layer 700. After a display cell 100 undergoes a cutting process and a module process, the window WDL may be disposed on the display device 10 to protect the components of the display device 10. The window WDL may be made of glass or plastic.

Figure 11:
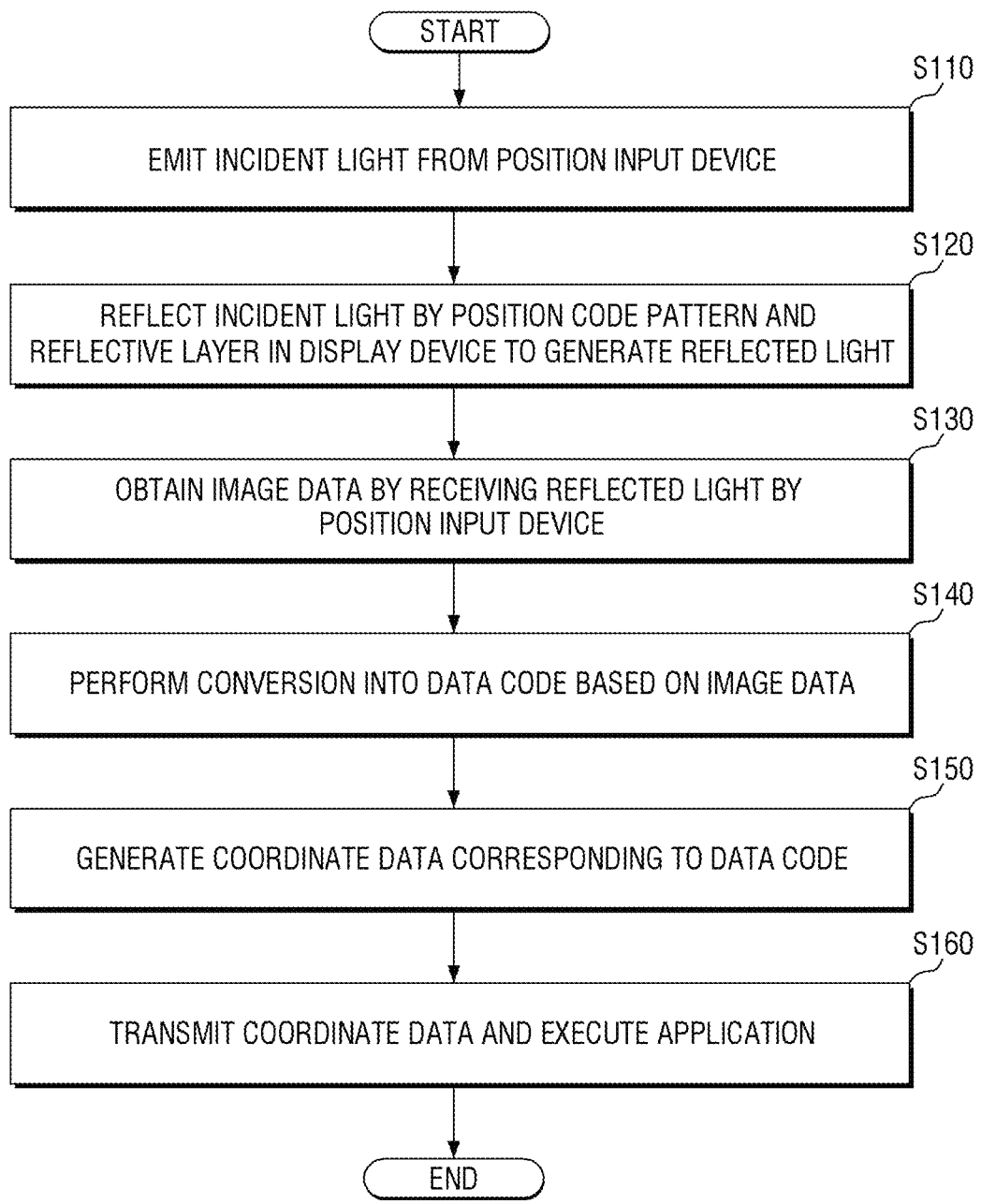
FIG. 11 is a flowchart illustrating a position sensing method of a touch sensing system according to an embodiment.
Figure 13:
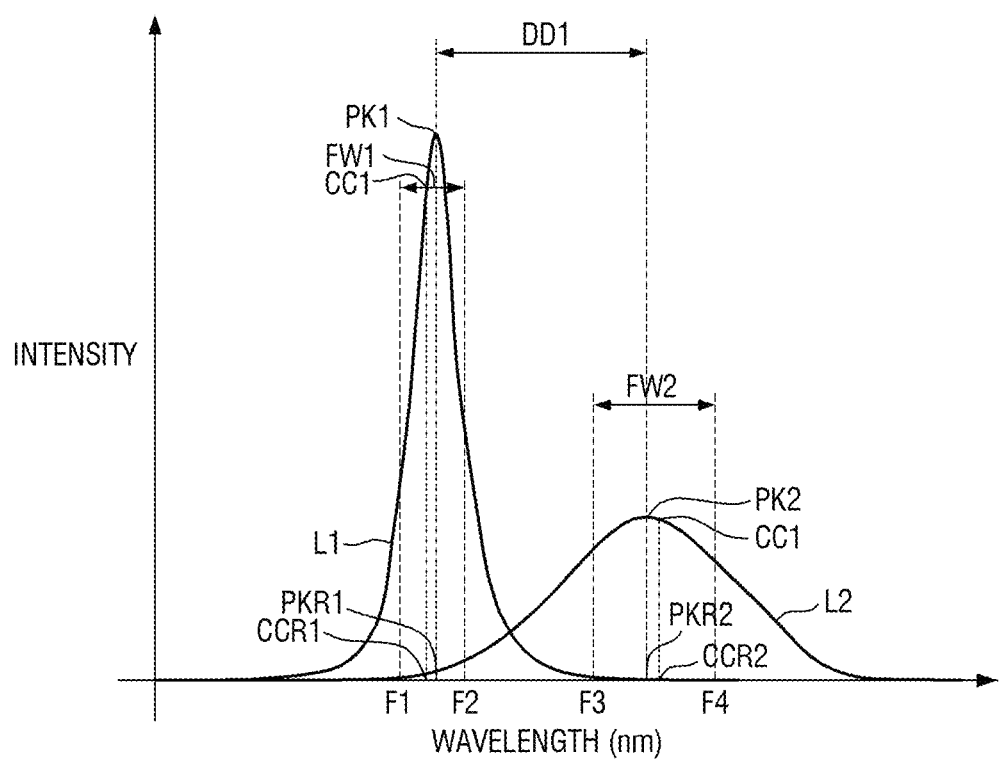
FIG. 13 is a graph illustrating intensities of incident light and reflected light of a touch sensing system according to an embodiment.
Figure 14:
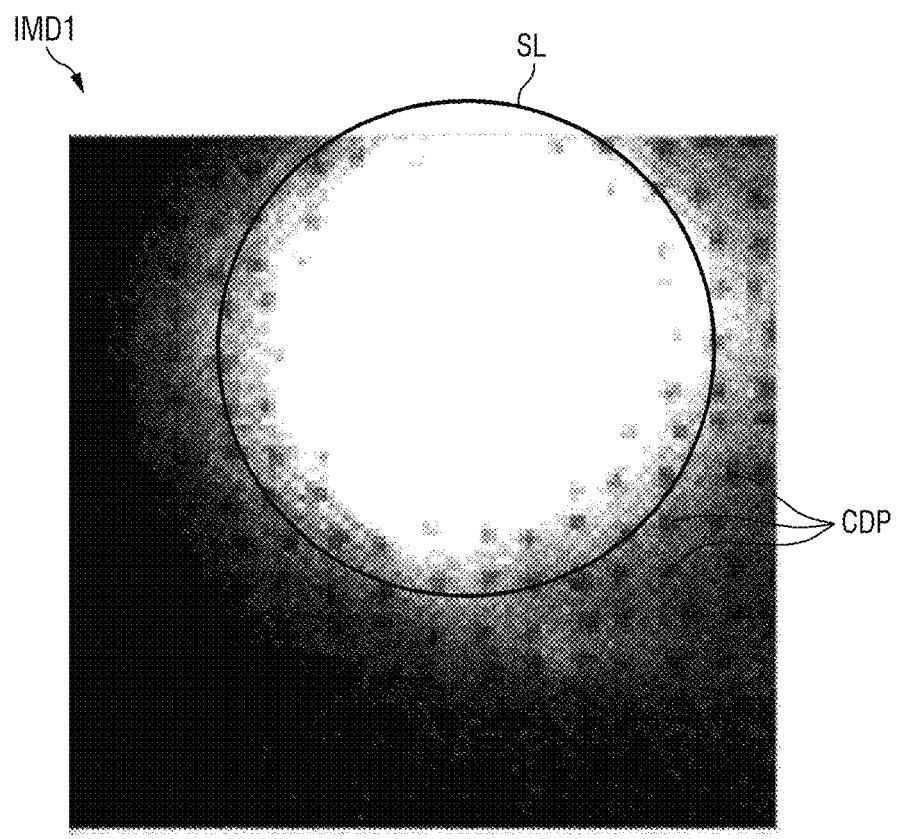
FIGS. 14 to 16 are images illustrating image data of a touch sensing system according to an embodiment.
Figure 15:
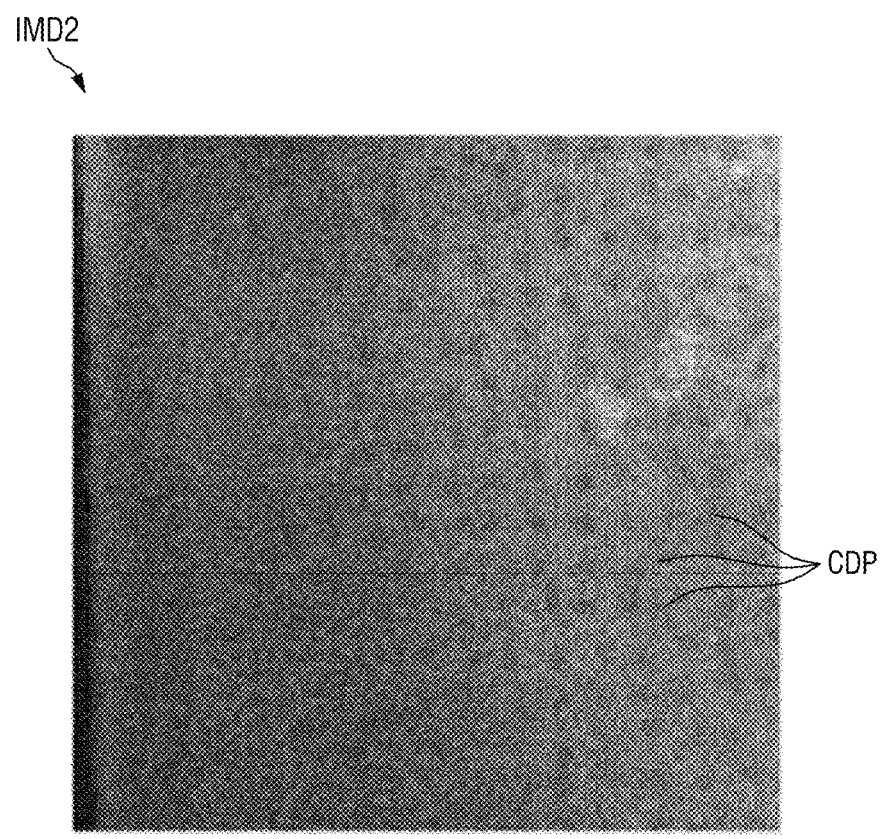
Figure 16:
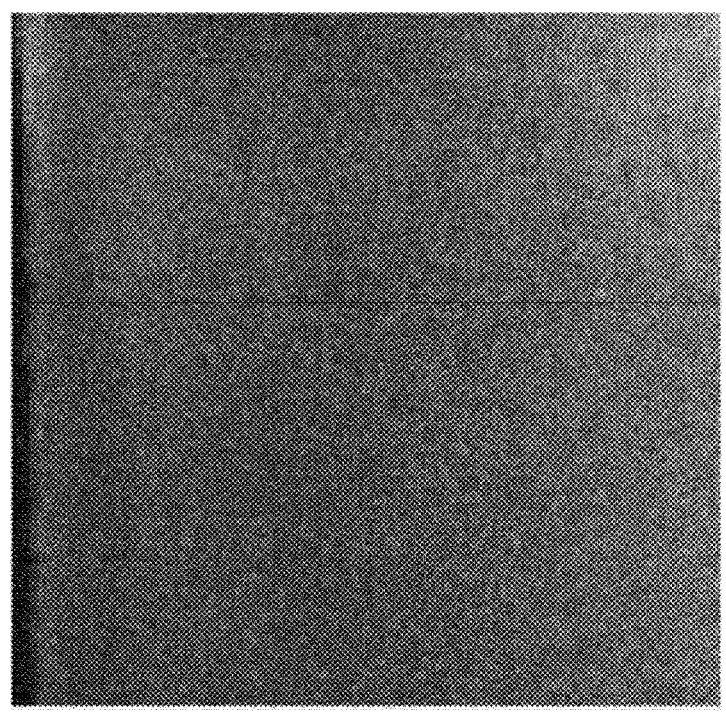
Figure 17:
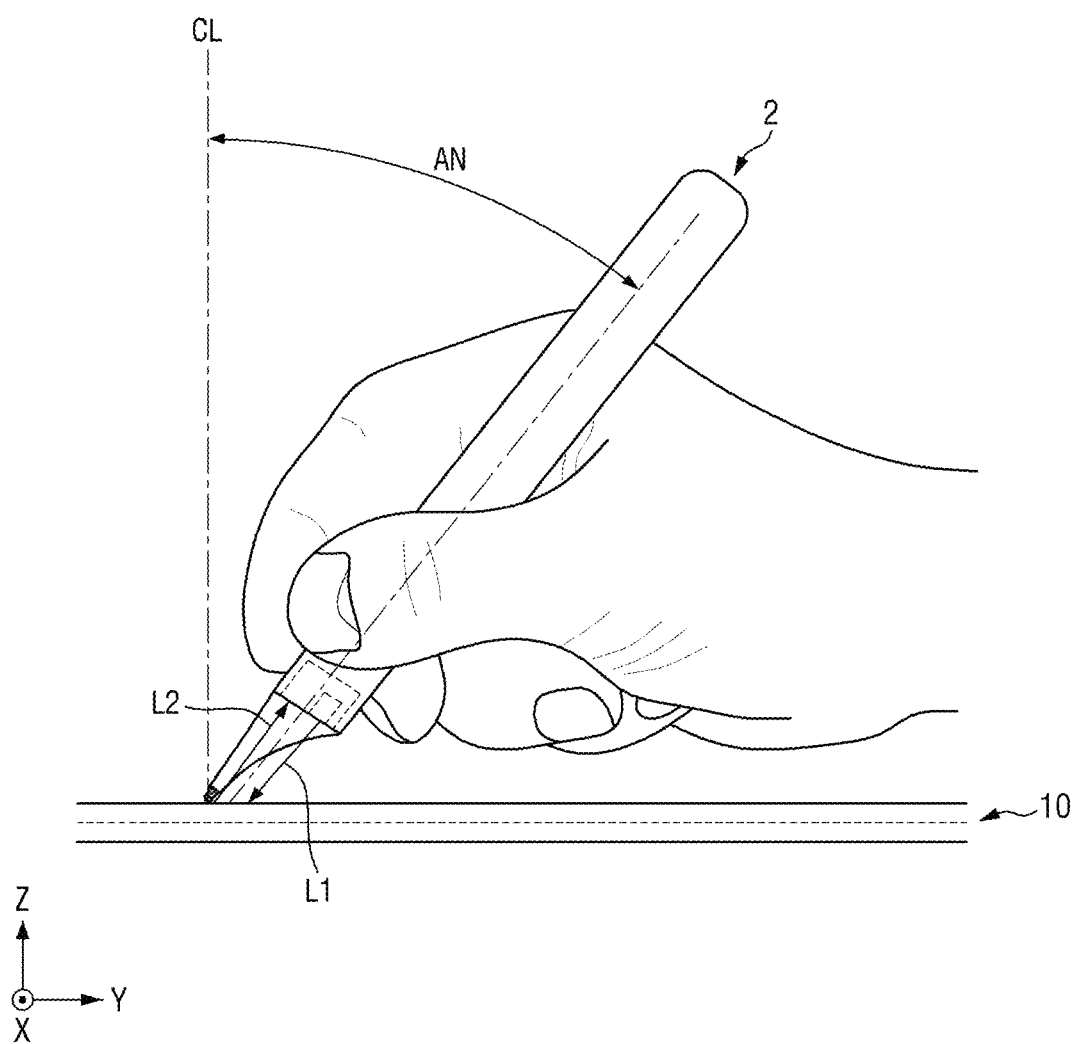
FIG. 17 is a cross-sectional view illustrating a position sensing method of a touch sensing system according to an embodiment.
Figure 18:
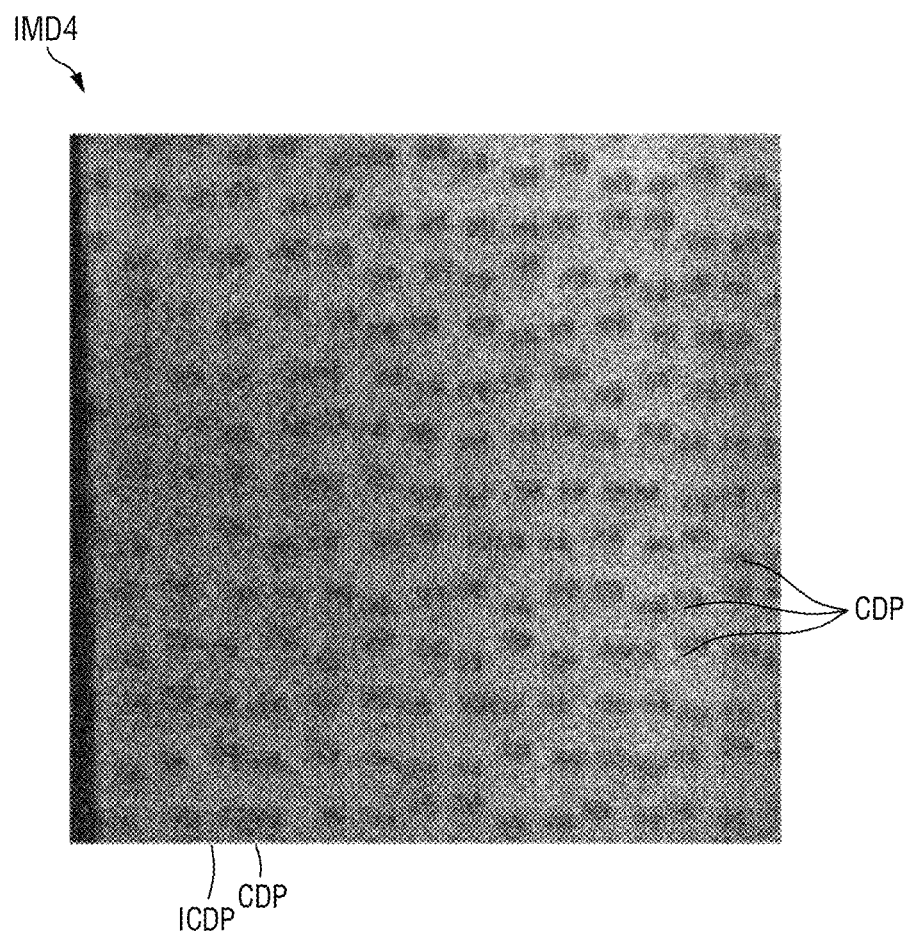
FIGS. 18 to 20 are images illustrating image data of a touch sensing system according to an embodiment.
Figure 19:
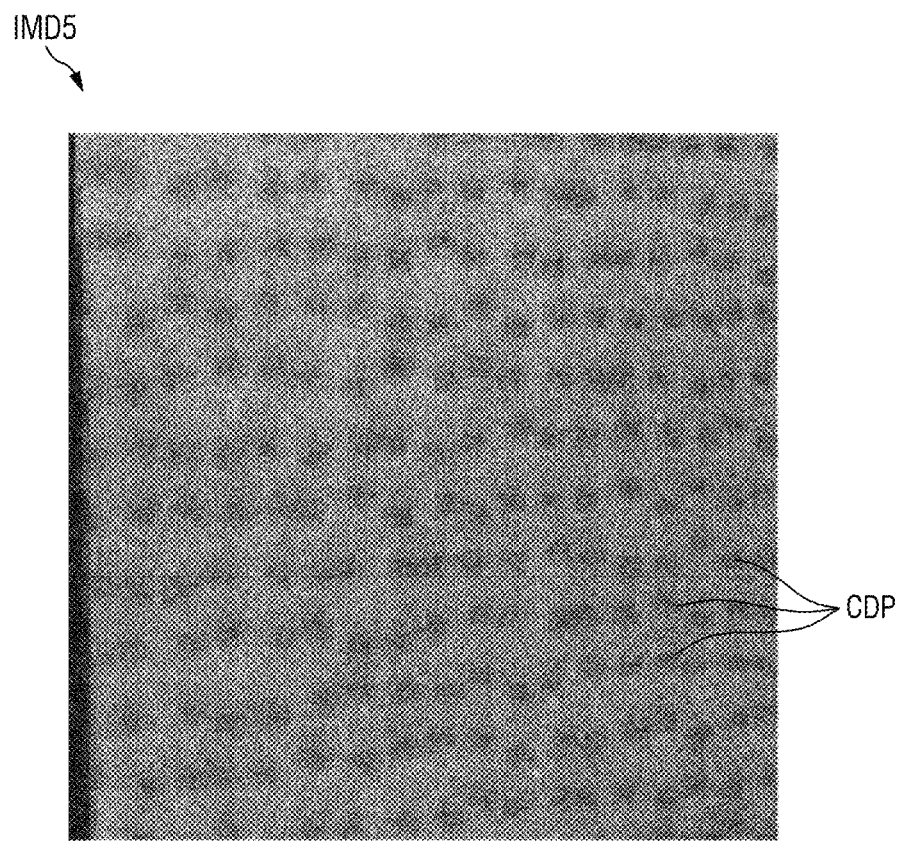
Figure 20:
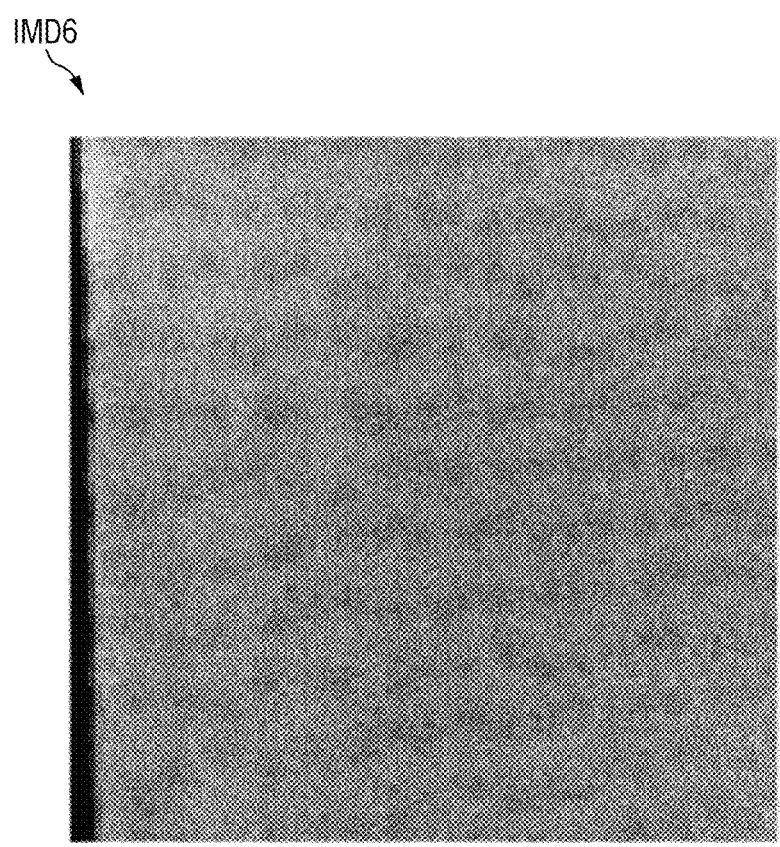

FIG. 11 is a flowchart illustrating a position sensing method of a touch sensing system according to an embodiment. FIG. 12 is a cross-sectional view illustrating the position sensing method of the touch sensing system according to an embodiment. FIG. 13 is a graph illustrating intensities of incident light and reflected light of a touch sensing system according to an embodiment. FIGS. 14 to 16 are images illustrating image data of a touch sensing system according to an embodiment. FIG. 17 is a cross-sectional view illustrating a position sensing method of a touch sensing system according to an embodiment. FIGS. 18 to 20 are images illustrating image data of a touch sensing system according to an embodiment.

First, the light emitting portion 24 of the position input device 2 emits incident light L1 (S110).

Referring further to FIGS. 12 and 13, the position input device 2 may emit light toward the display device 10. The light emitting portion 24 of the position input device 2 may output the incident light L1, and the output incident light L1 may be reflected directly or by a reflective member 28 to be incident on the display device 10.

FIGS. 12 to 16 are illustrative views when the incident light L1 is vertically incident from the position input device 2 to the display device 10. That is, FIGS. 12 to 16 illustrate a case in which the incident light L1 is parallel to the helical axis CL. For example, the incident light L1 of the position input device 2 may be incident on the display device 10 in a state of being inclined by −5° to 5° from the helical axis CL. However, embodiments of the disclosure are not limited thereto, and the light emitting portion 24 may emit light in a state inclined at a predetermined angle. For example, when the display device 10 extends along the first direction X, and accordingly, the helical axis CL of the liquid crystal layer 710 extends along the third direction Z, the light emitting portion 24 of the position input device 2 may emit light in a state inclined at a predetermined angle from the helical axis CL. That is, the incident light L1 may be incident on the display device 10 in a state inclined at a predetermined angle from the helical axis CL.

The incident light L1 emitted by the light emitting portion 24 may be light in an infrared band. For example, when a wavelength of an intensity having the largest intensity value among the intensities of the incident light L1 is defined as a peak wavelength, a first peak wavelength PK1 of the incident light L1 may have an intensity value of 860 nm or about 860 nm. In addition, when a width of wavelengths having an intensity value that is half of the intensity value at the peak wavelength of light is defined as a wavelength band, a first wavelength band FW1 of the incident light L1 may be 780 nm to 900 nm. In addition, when an average value of the wavelengths at both ends of the wavelength band is defined as a central wavelength, a first central wavelength CCR1 may be an average value of a first wavelength F1 and a second wavelength F2 at both ends of the first wavelength band FW1. For example, the first central wavelength CCR1 may be 850 nm, but embodiments of the disclosure are not limited thereto.

Secondly, the incident light L1 incident on the display device 10 is reflected by the reflective layer 700 to generate reflected light L2 (S120).

When the incident light L1 incident on the display device 10 is reflected by the reflective layer 700, the reflected light L2 may have a wavelength different from that of the incident light L1 when the reflective layer 700 includes the cholesteric liquid crystal as described above. For example, when the incident light L1 is light in the infrared band, the reflected light L2 may also be in the infrared band. In addition, the wavelength band of the reflected light L2 may be greater than the wavelength band of the incident light L1. A second wavelength band FW2, a second peak wavelength PKR2, and a second central wavelength CCR2 of the reflected light L2 may be determined as illustrated in Table 1 below.

TABLE 1

|  | A | B | C | D | E | F |
| --- | --- | --- | --- | --- | --- | --- |
| FW2 (nm) | 500 or less | 780 to 920 | 800 to 960 | 840 to 980 | 860 to 1010 | 910 to 1060 |
| PKR2 (nm) | — | 850 | 870 | 910 | 960 | 1000 |
| CCR2 (nm) | — | 850 | 880 | 910 | 935 | 985 |
| a*/b* | 8.9/14.2 | −0.3/−3.7 | −0.3/−3.7 | −0.5/−3.2 | −0.5/−3.2 | −0.5/−3.2 |

Table 1 illustrates the results of the reflected light L2 when the first peak wavelength PK1 of the incident light L1 emitted by the light emitting portion 24 is 860 nm, the first wavelength band FW1 of the incident light L1 is 780 nm to 900 nm, and the incident light L1 is incident on the reflective layer 700 in a state inclined within the range of −5° to 5° from the helical axis CL. In Table 1, FW2 indicates the second wavelength band FW2 of the reflected light L2, PKR2 indicates the second peak wavelength PKR2 of the reflected light L2, CCR2 indicates the second central wavelength CCR2 of the reflected light L2, a* indicates color information of a color difference system indicating a ratio of red of the reflected light L2, b* indicates color information of a color difference system indicating a ratio of yellow, and A to F indicate each case according to different designs of the reflective layers 700.

For example, the case A represents a case in which the reflective layer 700 is designed so that the reflected light L2 has the second wavelength band FW2 of 780 nm to 920 nm. In this case, the second peak wavelength PKR2 may have a value of 850 nm, and the second central wavelength CCR2 may have a value of 850 nm. In addition, in the case A, the reflected light L2 may have wavelengths of red and yellow bands, and the reflected light L2 may be visually recognized as red or yellow. That is, since the reflected light L2 has a visible ray wavelength band, the reflected light L2 may be visually recognized when the user uses the position input device 2. In addition, the case B represents a case in which the reflective layer 700 is designed so that the reflected light L2 has the second wavelength band FW2 of 800 nm to 960 nm. In this case, the second peak wavelength PKR2 may have a value of 870 nm, and the second central wavelength CCR2 may have a value of 880 nm. In addition, in the case B, the reflected light L2 may not have light of the visible ray wavelength band. That is, when the user uses the position input device 2, the reflected light L2 may not be visually recognized. In addition, the case E represents a case in which the reflective layer 700 is designed so that the reflected light L2 has the second wavelength band FW2 of 880 nm to 1010 nm. In this case, the second peak wavelength PKR2 may have a value of 960 nm, and the second central wavelength CCR2 may have a value of 935 nm. In addition, in the case E, the reflected light L2 may not have light of the visible ray wavelength band. That is, when the user uses the position input device 2, the reflected light L2 may not be visually recognized.

Thirdly, image data is obtained by receiving the reflected light L2 from the position input device 2 (S130).

Referring further to FIGS. 14 to 16, the light receiving portion 25 of the position input device 2 may obtain image data by receiving the reflected light L2 reflected from the reflective layer 700. For example, FIG. 14 illustrates first image data IMD1 obtained in the case B in Table 1 above, FIG. 15 illustrates second image data IMD2 obtained in the case E in Table 1 above, and FIG. 16 illustrates third image data IMD3 obtained in the case F in Table 1 above. In the case B in Table 1 which is the embodiment of FIG. 14, the reflective layer 700 may be designed so that the reflected light L2 has the second wavelength band FW2 of 800 nm to 960 nm. In this case, an overlapping wavelength band of the incident light L1 and the reflected light L2 may be larger than is needed. Accordingly, a light saturation area SL in which the code pattern unit CDP is not recognized due to a high intensity of the reflected light L2 may be generated on the first image data IMD1. Since the light saturation area SL is generated, the first image data IMD1 may not include information on the code pattern unit CDP disposed in the light saturation area SL.

In addition, in the case E in Table 1 which is the embodiment of FIG. 15, the reflective layer 700 may be designed so that the reflected light L2 has the second wavelength band FW2 of 860 nm to 1010 nm. That is, the second peak wavelength PKR2 may have a value of 960 nm, and the second central wavelength CCR2 may have a value of 935 nm. In this case, the light saturation area SL may not be generated in the second image data IMD2 according to the overlapping wavelength band of the incident light L1 and the reflected light L2. That is, the code pattern unit CDP may be visually recognized in the second image data IMD2. In addition, in the case F in Table 1 which is the embodiment of FIG. 16, the reflective layer 700 may be designed so that the reflected light L2 has the second wavelength band FW2 of 910 nm to 1060 nm. That is, the second peak wavelength PKR2 may have a value of 1000 nm, and the second central wavelength CCR2 may have a value of 985 nm. In this case, the overlapping wavelength band of the incident light L1 and the reflected light L2 may be smaller than is needed. Accordingly, visibility of the code pattern unit CDP may decrease in the third image data IMD3.

In summary, when the reflected light L2 has a wavelength band smaller than the second wavelength band of 840 nm to 980 nm or 860 nm to 1010 nm of the reflected light L2, the reflected light L2 may have light of a red or yellow wavelength band, and thus the reflected light L2 may be visually recognized by the user. In addition, since the light saturation area SL is generated in the image data, the information on the code pattern unit CDP may not be included in a partial area of the image data. On the other hand, when the reflected light L2 has a wavelength band greater than the second wavelength band of 840 nm to 980 nm or 860 nm to 1010 nm of the reflected light L2, the information on the code pattern unit CDP may not be included in the image data. That is, when the reflected light L2 has a wavelength band of the second wavelength band of 840 nm to 980 nm or 860 nm to 1010 nm of the reflected light L2, information of a desirable code pattern unit CDP may be included in the image data.

In addition, referring further to FIGS. 17 to 20, the position input device 2 may emit light in a state inclined at a predetermined angle as described above. For example, when the user uses the position input device 2, the position input device 2 may be inclined at an incident angle AN from the helical axis CL. That is, the incident light L1 of the position input device 2 may have the incident angle AN and may be incident in a state inclined by the incident angle AN from the helical axis CL. In this case, the incident angle AN may be 0° to 40°.

Accordingly, the light receiving portion 25 of the position input device 2 may receive the reflected light L2 of the incident light L1 incident in the state inclined by the incident angle AN. In addition, it may be necessary to calculate coordinate data based on the image data obtained from the received reflected light L2. For example, the light receiving portion 25 of the position input device 2 may obtain the image data by receiving the reflected light L2 of the incident light L1 having the incident angle AN of 0° to 40°. When the image data includes an image of the code pattern unit CDP, the position input device 2 may calculate coordinate data and calculate a touch position.

In summary, since the reflective layer 700 has a predetermined reflectance, the image of the code pattern unit CDP may be included in the image data, and the position input device 2 may calculate the touch position. That is, the reflective layer 700 may have a reflectance that is a ratio of reflecting light from incident external light, and the reflectance of the reflective layer 700 may be 10% to 50%. Hereinafter, a case in which the first peak wavelength PK1 of the wavelength of the incident light L1 emitted by the light emitting portion 24 is 860 nm, the first wavelength band FW1 of the incident light L1 is 780 nm to 900 nm, and the second wavelength band of the reflected light L2 is 860 nm to 1010 nm will be described.

Referring further to FIG. 18, for example, when the reflectance of the reflective layer 700 exceeds 50%, the light receiving portion 25 of the position input device 2 may obtain fourth image data IMD4 by receiving sufficient reflected light L2. That is, the fourth image data IMD4 may include an image of the code pattern unit CDP of the display device 10. On the other hand, when the reflectance of the reflective layer 700 exceeds 50%, an intensity of the incident light L1 reflected by the reflective layer 700 and the code pattern unit CDP may be high. Specifically, when the incident light L1 is reflected by the reflective layer 700 and the code pattern unit CDP, the reflected light L2 reflected by the code pattern unit CDP may be reflected again by the reflective layer 700 and may be reflected again by the code pattern unit CDP. That is, as the intensity of the incident light L1 reflected by the reflective layer 700 and the code pattern unit CDP increases, the reflected light L2 re-reflected by the code pattern unit CDP may generate an image of an imaginary code pattern unit ICDP in the fourth image data IMD4. Accordingly, the image of the code pattern unit CDP and the image of the imaginary code pattern unit ICDP may be generated adjacent to each other in the fourth image data IMD4.

On the other hand, referring further to FIG. 19, when the reflectance of the reflective layer 700 is 10% to 50%, the light receiving portion 25 of the position input device 2 may obtain fifth image data IMD5 by receiving sufficient reflected light L2. That is, the fifth image data IMD5 may include an image of the code pattern unit CDP of the display device 10. On the other hand, when the reflectance of the reflective layer 700 does not exceed 50%, an image of an imaginary code pattern unit ICDP may not be generated in the fifth image data IMD5. That is, the fifth image data IMD5 may include an image of the code pattern unit CDP.

Meanwhile, referring further to FIG. 20, when the reflectance of the reflective layer 700 is smaller than 10%, the light receiving portion 25 of the position input device 2 may not receive sufficient reflected light L2. Specifically, the intensity of the reflected light L2 reflected by the reflective layer 700 and the code pattern unit CDP of the incident light L1 incident from the light emitting portion 24 of the position input device 2 may be small. Furthermore, as the incident angle AN increases, the intensity of the reflected light L2 received by the light receiving portion of the position input device 2 decreases. In this case, sufficient reflected light L2 for recognizing the code pattern unit CDP may not be formed in the reflected light L2. That is, an image of the code pattern unit CDP may not be included in a partial area of sixth image data IMD6 obtained through the reflected light L2.

In summary, when the reflectance of the reflective layer 700 exceeds 50%, the image of the code pattern unit CDP and the image of the imaginary code pattern unit ICDP may be generated adjacent to each other in the fourth image data IMD4. In addition, when the reflectance of the reflective layer 700 is 10% to 50%, the image of the code pattern unit CDP may be included in the fifth image data IMD5. In addition, when the reflectance of the reflective layer 700 is smaller than 10%, the image of the code pattern unit CDP may not be included in the partial area of the sixth image data IMD6. That is, when the reflectance of the reflective layer 700 is 10% to 50%, it is possible to obtain image data including a code pattern unit CDP.

Next, the code processor 262 of the position input device 2 performs conversion into a data code based on the image data (S140), generates coordinate data corresponding to the data code (S150), and transmits the coordinate data to the display device 10 (S160). An application may be additionally executed based on the transmitted coordinate data. For example, application may be executed if the coordinate data corresponds to the location of an icon representing the application.

The code processor 262 of the position input device 2 may perform conversion into each data code based on the image data received from the light receiving portion 25. The code processor 262 may detect a reference point (RP in FIG. 24), a first reference line (HRL in FIG. 24), a second reference line (VRL in FIG. 24), and a plurality of code patterns (CP in FIG. 24) of the code pattern unit CDP based on the image of the code pattern unit CDP included in the image data. The code processor 262 may perform conversion into a data code corresponding to each code pattern based on the plurality of detected code patterns.

For example, in the case of the second image data IMD2 of FIG. 15, the code processor 262 may detect a plurality of code patterns (CP in FIG. 24) from the image of the code pattern unit CDP based on the second image data IMD2. The code processor 262 may generate coordinate data according to the plurality of code patterns (CP in FIG. 24) and transmit the coordinate data to the display device 10. On the other hand, in the case of the first image data IMD1 of FIG. 16, the image of the code pattern unit CDP is not included in a light saturation area SL of the first image data IMD1. Therefore, the code processor 262 may not detect the plurality of code patterns from the image of the code pattern unit CDP in the light saturation area SL of the first image data IMD1. That is, when the reflective layer 700 is designed so that the second wavelength band of the reflected light L2 has 860 nm to 1010 nm and the reflectance of the reflective layer 700 is 10% to 50%, the code processor 262 may generate the coordinate data according to the plurality of code patterns and transmit the coordinate data to the display device 10.

Subsequently, the code processor 262 may generate coordinate data corresponding to the data code and transmit the coordinate data corresponding to each image data to the display device 10. Accordingly, the display device 10 may execute an application at a position corresponding to the coordinate data. A method for the code processor 262 to generate a data code based on the plurality of code patterns will be described later with reference to FIGS. 24 and 25.

According to the embodiment, since a second wavelength band FW2 of the reflected light L2 of the reflective layer 700 is designed to have a predetermined range, and the reflectance of the reflective layer 700 has 10% to 50%, a touch sensing system 1 may detect an accurate touch position by recognizing the code pattern unit CDP.

Figure 21:
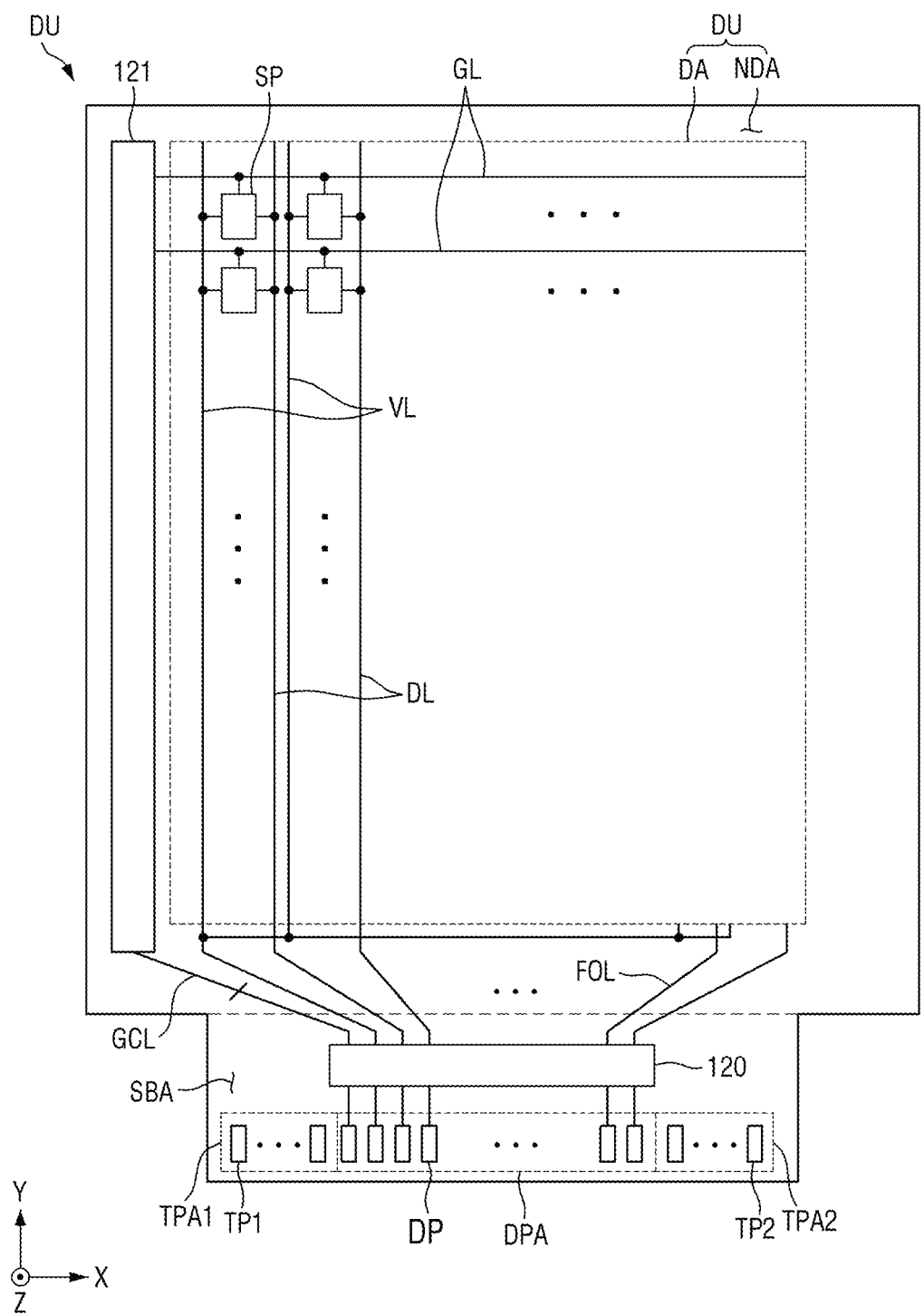
FIG. 21 is a plan view illustrating a display unit of the display device according to an embodiment.

FIG. 21 is a plan view illustrating a display unit of the display device according to an embodiment.

Referring to FIG. 21, the display unit DU may include a display area DA and a non-display area NDA.

The display area DA is an area displaying an image, and may be defined as a central area of the display panel 110. The display area DA may include a plurality of pixels SP, a plurality of gate lines GL, a plurality of data lines DL, and a plurality of power lines VL. Each of the plurality of pixels SP may be defined as a minimum unit for outputting light.

The plurality of gate lines GL may supply a gate signal received from a gate driving unit 121 to the plurality of pixels SP. The plurality of gate lines GL may extend in the first direction X and may be spaced apart from each other in the second direction Y intersecting the first direction X.

The plurality of data lines DL may supply the data voltage received from the display driving unit 120 to the plurality of pixels SP. The plurality of data lines DL may extend in the second direction Y and may be spaced apart from each other in the first direction X.

The plurality of power lines VL may supply the power voltage received from the display driving unit 120 to the plurality of pixels SP. Here, the power voltage may be at least one of a driving voltage, an initialization voltage, and a reference voltage. The plurality of power lines VL may extend in the second direction Y and may be spaced apart from each other in the first direction X.

The non-display area NDA may surround the display area DA. The non-display area NDA may include a gate driving unit 121, fan-out lines FOL, and gate control lines GCL. The gate driving unit 121 may generate a plurality of gate signals based on the gate control signal, and may sequentially supply the plurality of gate signals to the plurality of gate lines GL according to a set order.

The fan-out lines FOL may extend from the display driving unit 120 to the display area DA. The fan-out lines FOL may supply the data voltage received from the display driving unit 120 to the plurality of data lines DL.

The gate control line GCL may extend from the display driving unit 120 to the gate driving unit 121. The gate control line GCL may supply the gate control signal received from the display driving unit 120 to the gate driving unit 121.

The sub-area SBA may include a display driving unit 120, a display pad area DPA, and first and second touch pad areas TPA1 and TPA2.

The display driving unit 120 may output signals and voltages for driving the display panel 110 to the fan-out lines FOL. The display driving unit 120 may supply a data voltage to the data lines DL through the fan-out lines FOL. The data voltage may be supplied to the plurality of pixels SP and may determine luminance of the plurality of pixels SP. The display driving unit 120 may supply the gate control signal to the gate driving unit 121 through the gate control line GCL.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 130 using an anisotropic conductive film or a low-resistance and high-reliability material such as SAP.

The display pad area DPA may include a plurality of display pad portions DP. The plurality of display pad portions DP may be connected to the main processor 150 through the circuit board 130. The plurality of display pad portions DP may be connected to the circuit board 130 to receive digital video data, and may supply the digital video data to the display driving unit 120.

FIG. 22 is a plan view illustrating a touch sensing unit of the display device according to an embodiment.

Referring to FIG. 22, the touch sensing unit TSU may include a touch sensor area TSA for sensing a user's touch, and a touch peripheral area TPA disposed around the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN and a plurality of dummy electrodes DME. The plurality of touch electrodes SEN may form mutual capacitance or self capacitance to sense a touch of an object or a person. The plurality of touch electrodes SEN may include a plurality of driving electrodes TE and a plurality of sensing electrodes RE.

The plurality of driving electrodes TE may be arranged in the first direction X and the second direction Y. The plurality of driving electrodes TE may be arranged in the first direction X and the second direction Y. The plurality of driving electrodes TE adjacent to each other in the second direction Y may be electrically connected to each other through a bridge electrode CE.

The plurality of driving electrodes TE may be connected to a first touch pad portion TP1 through a driving line TL. The driving line TL may include a lower driving line TLa and an upper driving line TLb. For example, some of the driving electrodes TE disposed on a lower side of the touch sensor area TSA may be connected to the first touch pad portion TP1 through the lower driving line TLa, and other driving electrodes TE disposed on an upper side of the touch sensor area TSA may be connected to the first touch pad portion TP1 through the upper driving line TLb. The lower driving line TLa may pass through a lower side of the touch peripheral area TPA and extend to the first touch pad portion TP1. The upper driving line TLb may extend to the first touch pad portion TP1 via upper, left, and lower sides of the touch peripheral area TPA. The first touch pad portion TP1 may be connected to the touch driving unit 140 through the circuit board 130.

The bridge electrode CE may be bent at least once. For example, the bridge electrode CE may have a clamp shape ("<" or ">"), but a planar shape of the bridge electrode CE is not limited thereto. The driving electrodes TE adjacent to each other in the second direction Y may be electrically connected to each other by a plurality of bridge electrodes CE, and even if any one of the plurality of bridge electrodes CE is disconnected, the driving electrodes TE may be stably connected to each other through the remaining bridge electrodes CE. The driving electrodes TE adjacent to each other may be connected by two bridge electrodes CE, but the number of bridge electrodes CE is not limited thereto.

The bridge electrodes CE may be disposed on a layer different from that of the plurality of driving electrodes TE and the plurality of sensing electrodes RE. The sensing electrodes RE adjacent to each other in the first direction X may be electrically connected to each other through a connection portion disposed on the same layer as that of the plurality of driving electrodes TE or the plurality of sensing electrodes RE, and the driving electrodes TE adjacent to each other in the second direction Y may be electrically connected to each other through the bridge electrode CE disposed on the layer different from that of the plurality of driving electrodes TE or the plurality of sensing electrodes RE. Therefore, even if the bridge electrodes CE overlap the plurality of sensing electrodes RE in the third direction Z, the plurality of driving electrodes TE and the plurality of sensing electrodes RE may be insulated from each other. A mutual capacitance may be formed between the driving electrode TE and the sensing electrode RE.

The plurality of sensing electrodes RE may extend in the first direction X and may be spaced apart from each other in the second direction Y. The plurality of sensing electrodes RE may be arranged in the first direction X and the second direction Y, and the sensing electrodes RE adjacent to each other in the first direction X may be electrically connected to each other through the connection portion.

The plurality of sensing electrodes RE may be connected to the second touch pad portion TP2 through a sensing line RL. For example, some of the sensing electrodes RE disposed on the right side of the touch sensor area TSA may be connected to the second touch pad portion TP2 through the sensing line RL. The sensing line RL may extend to the second touch pad portion TP2 via the right and lower sides of the touch peripheral area TPA. The second touch pad portion TP2 may be connected to the touch driving unit 140 through the circuit board 130.

Each of the plurality of dummy electrodes DME may be surrounded by the driving electrode TE or the sensing electrode RE. Each of the plurality of dummy electrodes DME may be spaced apart from and insulated from the driving electrode TE or the sensing electrode RE. Accordingly, the dummy electrode DME may be electrically floating.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 130 using an anisotropic conductive film or a low-resistance and high-reliability material such as SAP.

The first touch pad area TPA1 may be disposed on one side of the display pad area DPA and may include a plurality of first touch pad portions TP1. The plurality of first touch pad portions TP1 may be electrically connected to the touch driving unit 140 disposed on the circuit board 130. The plurality of first touch pad portions TP1 may supply a touch driving signal to the plurality of driving electrodes TE through the plurality of driving lines TL.

The second touch pad area TPA2 may be disposed on the other side of the display pad area DPA and may include a plurality of second touch pad portions TP2. The plurality of second touch pad portions TP2 may be electrically connected to the touch driving unit 140 disposed on the circuit board 130. The touch driving unit 140 may receive a touch sensing signal through the plurality of sensing lines RL connected to the plurality of second touch pad portions TP2, and may sense a change in mutual capacitance between the driving electrode TE and the sensing electrode RE.

As another example, the touch driving unit 140 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driving unit 140 may sense a charge change amount of each of the plurality of driving electrodes TE and the plurality of sensing electrodes RE based on the touch sensing signal.

FIG. 23 is an enlarged view of area A1 illustrated in FIG. 22.

Referring to FIG. 23, the plurality of driving electrodes TE, the plurality of sensing electrodes RE, and the plurality of dummy electrodes DME may be disposed on the same layer and may be spaced apart from each other.

The plurality of driving electrodes TE may be arranged in the first direction X and the second direction Y. The plurality of driving electrodes TE may be arranged in the first direction X and the second direction Y. The plurality of driving electrodes TE adjacent to each other in the second direction may be electrically connected to each other through a bridge electrode CE.

The plurality of sensing electrodes RE may extend in the first direction X and may be spaced apart from each other in the second direction Y. The plurality of sensing electrodes RE may be arranged in the first direction X and the second direction Y, and the sensing electrodes RE adjacent to each other in the first direction X may be electrically connected to each other through a connection portion RCE. For example, the connection portion RCE of the sensing electrodes RE may be disposed within the shortest distance between the driving electrodes TE adjacent to each other.

The plurality of bridge electrodes CE may be disposed on a layer different from that of the driving electrodes TE and the sensing electrodes RE. The bridge electrode CE may include a first portion CEa and a second portion CEb. For example, the first portion CEa of the bridge electrode CE may be connected to the driving electrode TE disposed on one side through a first contact hole CNT1 to extend in a third diagonal direction DR3. The second portion CEb of the bridge electrode CE may be bent from the first portion CEa in an area overlapping the sensing electrode RE to extend in a second diagonal direction DR2, and may be connected to the driving electrode TE disposed on the other side through the first contact hole CNT1. Hereinafter, the first diagonal direction DR1 may be a direction between the first direction X and the second direction Y, the second diagonal direction DR2 may be a direction between a direction opposite to the second direction Y and the first direction X, the third diagonal direction DR3 may be a direction opposite to the first diagonal direction DR1, and a fourth diagonal direction DR4 may be a direction opposite to the second diagonal direction DR2. Therefore, each of the plurality of bridge electrodes CE may connect the driving electrodes TE adjacent to each other in the second direction Y.

For example, the plurality of driving electrodes TE, the plurality of sensing electrodes RE, and the plurality of dummy electrodes DME may be formed in a mesh structure or a net structure in a plan view. The plurality of driving electrodes TE, the plurality of sensing electrodes RE, and the plurality of dummy electrodes DME may surround each of first to third light emitting areas EA1, EA2, and EA3 of a pixel group PG in a plan view. Therefore, the plurality of driving electrodes TE, the plurality of sensing electrodes RE, and the plurality of dummy electrodes DME may not overlap the first to third light emitting areas EA1, EA2, and EA3. The plurality of bridge electrodes CE may also not overlap the first to third light emitting areas EA1, EA2, and EA3. Therefore, the display device 10 may prevent a luminance of light emitted from the first to third light emitting areas EA1, EA2, and EA3 from being reduced by the touch sensing unit TSU.

Each of the plurality of driving electrodes TE may include a first portion TEa extending in the first diagonal direction DR1 and a second portion TEb extending in the second diagonal direction DR2. Each of the plurality of sensing electrodes RE may include a first portion REa extending in the first diagonal direction DR1 and a second portion REb extending in the second diagonal direction DR2.

At least some of the plurality of touch electrodes SEN may include a code pattern unit CDP. At least some of the plurality of driving electrodes TE or at least some of the plurality of sensing electrodes RE may include a code pattern unit CDP. The code pattern unit CDP may include a plurality of code patterns cut according to a specific criterion and having or representing position information. The plurality of code patterns may correspond to a value of a preset data code. For example, the plurality of code patterns may be provided by cutting one of a plurality of stems extending from an intersecting point of at least some of the touch electrodes SEN, but the disclosure is not limited thereto. The plurality of stems of at least some of the touch electrodes SEN may extend in the first to fourth diagonal directions DR1, DR2, DR3, and DR4 from the intersecting point, and a stem extending in one of the first to fourth diagonal directions DR1, DR2, DR3, and DR4 may be cut. A cutting direction of the stem may correspond to a value of a preset data code constituting or representing position information.

The plurality of pixels may include first to third sub-pixels, and each of the first to third sub-pixels may include first to third light emitting areas. The electrodes may not overlap the first to third light emitting areas. In addition, since the code pattern unit CDP is formed on some of the electrodes, the code pattern unit CDP may not overlap the first to third light emitting areas.

FIG. 24 is a view illustrating an example of a code pattern unit in the display device according to an embodiment. FIG. 25 is a view illustrating a data code corresponding to the code pattern unit of FIG. 24.

Referring to FIGS. 24 and 25, the plurality of touch electrodes SEN may be formed in a mesh structure or a net structure in a plan view. Sides of the minimum unit of the plurality of touch electrodes SEN may intersect each other in the first diagonal direction DR1 and the second diagonal direction DR2. At least some of the plurality of touch electrodes SEN may include a code pattern unit CDP. At least some of the plurality of driving electrodes TE or at least some of the plurality of sensing electrodes RE may include a code pattern unit CDP.

The code pattern unit CDP may include a reference point RP, a first reference line HRL, a second reference line VRL, and a plurality of code patterns CP.

The reference point RP may be an identification reference of the code pattern unit CDP. For example, the reference point RP may correspond to an area in which the intersecting point of at least some of the touch electrodes SEN is cut. For example, the reference point RP may be disposed on an upper left side of the code pattern unit CDP, but is not limited thereto.

The first reference line HRL may extend in the first direction X from the reference point RP. The first reference line HRL may be defined by connecting a plurality of intersecting points ITS disposed in the first direction X of the reference point RP. For example, when the first reference line HRL is defined by connecting six intersecting points ITS, the plurality of code patterns CP may be arranged along six columns including the six intersecting points ITS.

The second reference line VRL may extend in the second direction Y from the reference point RP. The second reference line VRL may be defined by connecting the plurality of intersecting points ITS disposed in the second direction Y of the reference point RP and a cut portion CTP disposed between the plurality of intersecting points ITS. For example, the second reference line VRL may be defined by connecting two intersecting points ITS, one cut portion CTP, and three intersecting points ITS, and the plurality of code patterns CP may be arranged along six rows including five intersecting points ITS and one cut portion CTP.

The plurality of code patterns CP may be disposed in an area defined by the first reference line HRL and the second reference line VRL. A gradation or a rotation angle of the plurality of code patterns CP with respect to a camera may be sensed by the first reference line HRL and the second reference line VRL. For example, when the first reference line HRL is defined by connecting six intersecting points ITS and the second reference line VRL is defined by connecting two intersecting points ITS, one cut portion CTP, and three intersecting points ITS, the plurality of code patterns CP may be arranged in a 6 by 6 matrix. However, the plurality of code patterns CP are not limited thereto, and may have various shapes. For example, the plurality of code patterns CP may extend in the first direction X or the second direction Y. Alternatively, the plurality of code patterns CP may have a shape extending along a side of a portion of the rhombus. Alternatively, the plurality of code patterns CP may have a shape such as a circle.

The plurality of code patterns CP may be cut according to a specific criterion to have or represent position information. The plurality of code patterns CP may correspond to a value of a preset data code DC. For example, the plurality of code patterns CP may be provided by cutting one of a plurality of stems extending from an intersecting point of at least some of the touch electrodes SEN. The plurality of stems of at least some of the touch electrodes SEN may extend in the first to fourth diagonal directions DR1, DR2, DR3, and DR4 from the intersecting point, and a stem extending in one of the first to fourth diagonal directions DR1, DR2, DR3, and DR4 may be cut. A cutting direction of the stem may correspond to a value of a preset data code DC constituting position information. For example, a code pattern CP disposed in an m-th row (hereinafter, m is a natural number) and an n-th column (hereinafter, n is a natural number) may correspond to a data code DC disposed in the m-th row and n-th column.

For example, a code pattern CP in which a stem in the first diagonal direction DR1 is cut may correspond to a data code DC of [00]. A code pattern CP in which a stem in the second diagonal direction DR2 is cut may correspond to a data code DC of [01]. A code pattern CP in which a stem in the third diagonal direction DR3 is cut may correspond to a data code DC of [10]. A code pattern CP in which a stem in the fourth diagonal direction DR4 is cut may correspond to a data code DC of [11].

A first_first code pattern CP11 disposed in a first row Row1 and a first column Col1 may have a stem cut in the first diagonal direction DR1, and a first_first data code DC11 may have a value of [00]. A sixth_first code pattern CP61 disposed in a sixth row Row6 and a first column Col1 may have a stem cut in the second diagonal direction DR2, and a sixth_first data code DC61 may have a value of [01]. A sixth_second code pattern CP62 disposed in a sixth row Row6 and a second column Col2 may have a stem cut in the third diagonal direction DR3, and a sixth_second data code DC62 may have a value of [10]. A first_sixth code pattern CP16 disposed in a first row Row1 and a sixth column Col6 may have a stem cut in the fourth diagonal direction DR4, and a first_sixth data code DC16 may have a value of [11].

The plurality of code patterns CP may further include a conductive pattern in which a plurality of stems extending from an intersecting point are not cut. The conductive pattern may not have a value of the data code DC (Null). The conductive pattern may be disposed at a necessary position so that the plurality of touch electrodes SEN may normally perform a touch operation. When the plurality of code patterns CP include the conductive pattern, deterioration of the plurality of touch electrodes SEN may be prevented. For example, a third_second code pattern CP32 disposed in a third row Row3 and a second column Col2 may correspond to the conductive pattern, and a third_second data code DC32 may not have a value (Null).

The display device 10 may include the plurality of code patterns CP provided on at least some of the plurality of touch electrodes SEN, thereby receiving a touch input of a touch position input device such as the position input device 2. The plurality of code patterns CP may be cut according to a specific criterion to have or represent position information, and may correspond to a preset data code DC on a one-to-one basis. Therefore, the display device 10 may use the data code DC to receive the coordinate data generated without complicated calculation and correction, thereby reducing costs, reducing power consumption, and simplifying a driving process. In addition, since the display device 10 includes the plurality of code patterns CP provided on at least some of the touch electrodes SEN, the display device 10 is not limited in size and may be applied to various electronic devices having a touch function.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:
1. A display device comprising:
   a substrate;
   a display layer disposed on the substrate and including a plurality of light emitting areas;
   a code pattern layer disposed on the display layer and including a plurality of position code patterns;
   a window; and
   a reflective layer disposed between the window and the code pattern layer,
   wherein the reflective layer receives a first light having a first wavelength band incident from the outside, reflects the first light off at least one of the position code patterns to generate reflected light and receives the reflected light to generate second light having a second wavelength band, and
   wherein a first peak wavelength of the first light is smaller than a second peak wavelength of the second light.
2. The display device of claim 1, wherein when the first peak wavelength refers to a wavelength of the first light having a highest intensity in the first wavelength band, and the second peak wavelength refers to a wavelength of the second light having a highest intensity in the second wave- length band, the second peak wavelength is smaller than the first peak wavelength by 50 nm to 100 nm.

3. The display device of claim 1, wherein a central wavelength of the second wavelength band is smaller than a central wavelength of the first wavelength band.

4. The display device of claim 3, wherein the first wavelength band is 780 nm to 900 nm, and the second wavelength band is 860 nm to 1010 nm.

5. The display device of claim 4, wherein when a ratio of an intensity of the second light to an intensity of the first light is defined as a reflectance of the reflective layer, the reflectance is 10% to 50%.

6. The display device of claim 1, wherein the reflective layer is disposed on the code pattern layer.

7. The display device of claim 1, wherein the reflective layer comprises:
  a first orientation film;
  a second orientation film disposed on the first orientation film; and
  a liquid crystal layer disposed between the first orientation film and the second orientation film and including cholesteric liquid crystals.

8. The display device of claim 7, wherein liquid crystal molecules of the cholesteric liquid crystals are arranged in a helical shape along a thickness direction of the liquid crystal layer.

9. A touch sensing system comprising:
  a display device for displaying an image; and
  a position input device for outputting first light having a first wavelength band, wherein the display device comprises:
  a display layer including a plurality of light emitting areas;
  a code pattern layer disposed on the display layer and including a plurality of position code patterns;
  a window; and
  a reflective layer disposed between the window and the code pattern layer, the reflective layer receiving the first light, and reflecting the first light off at least one of the position code patterns to generate reflected light and receiving the reflected light to generate second light having a second wavelength band different from the first wavelength band,
  wherein the position input device senses the second light, determines codes of the plurality of position code patterns from the sensed second light, and calculates touch coordinate data by analyzing the codes.

10. The touch sensing system of claim 9, wherein a central wavelength of the second wavelength band is smaller than a central wavelength of the first wavelength band.

11. The touch sensing system of claim 9, wherein when a wavelength of the first light having a highest intensity in the first wavelength band is defined as a first peak wavelength, and a wavelength of the second light having a highest intensity in the second wavelength band is defined as a second peak wavelength, the second peak wavelength of the second light is smaller than the first peak wavelength of the first light.

12. The touch sensing system of claim 11, wherein the second peak wavelength is smaller than the first peak wavelength by 50 nm to 100 nm.

13. The touch sensing system of claim 12, wherein when a ratio of an intensity of the second light to an intensity of the first light is defined as a reflectance of the reflective layer, the reflectance is 10% to 50%.

14. The touch sensing system of claim 9, further comprising a main processor receiving the touch coordinate data from the position input device and executing an application corresponding to the touch coordinate data.

15. The touch sensing system of claim 9, further comprising a main processor calculating the touch coordinate data by sensing a change in capacitance formed by a plurality of touch electrodes and executing an application corresponding to the touch coordinate data, the code pattern layer including the plurality of touch electrodes.

16. The touch sensing system of claim 15, wherein the position input device comprises:
  a light emitting portion emitting the first light to the display device; and
  a light receiving portion receiving the second light reflected from the display device, wherein the light emitting portion emits infrared light.

17. The touch sensing system of claim 16, wherein the light receiving portion receives the infrared light.

18. The touch sensing system of claim 17, wherein the light emitting portion emits light having a wavelength of 780 nm to 900 nm, and the light receiving portion receives light having a wavelength of 840 nm to 1010 nm.

19. The touch sensing system of claim 9, wherein the reflective layer comprises:
  a first orientation film;
  a second orientation film disposed on the first orientation film; and
  a first liquid crystal layer disposed between the first orientation film and the second orientation film and including cholesteric liquid crystals.

20. The touch sensing system of claim 19, wherein liquid crystal molecules of the cholesteric liquid crystals are arranged in a helical shape along a thickness direction of the first liquid crystal layer.

21. A display device comprising:
  a processor;
  a display panel comprising a plurality of pixels for displaying an image; and
  a touch panel disposed on the display panel, the touch panel comprising a plurality of electrodes comprising a first set of the electrodes for sensing a touch input and a second set of the electrodes including a plurality of code patterns corresponding to a plurality data codes;
  a reflective layer disposed below the touch panel,
  wherein the reflective layer of the display panel is configured to receive a first light having a first wavelength band, and reflect the first light off at least one of the code patterns to generate reflected light, and receive the reflected light to generate second light having a second wavelength band different from the first wavelength band, and
  wherein the first wavelength band is 780 nm to 900 nm, and the second wavelength band is 860 nm to 1010 nm.

22. The display device of claim 21, wherein the reflective layer is disposed between the display panel and the touch panel.

23. The display device of claim 21, wherein the reflective layer is disposed inside the display panel as a partial layer of the display panel.

* * * * *